(12) United States Patent
Joseph

(10) Patent No.: US 8,979,338 B2
(45) Date of Patent: Mar. 17, 2015

(54) SYSTEM FOR COMBINING LASER ARRAY OUTPUTS INTO A SINGLE BEAM CARRYING DIGITAL DATA

(71) Applicant: TriLumina Corporation, Albuquerque, NM (US)

(72) Inventor: John R. Joseph, Albuquerque, NM (US)

(73) Assignee: TriLumina Corp., Albuquerque, NM (US)

( * ) Notice: Subject to any disclaimer, the term of this patent is extended or adjusted under 35 U.S.C. 154(b) by 0 days.

(21) Appl. No.: 14/085,686

(22) Filed: Nov. 20, 2013

(65) Prior Publication Data

US 2014/0079088 A1 Mar. 20, 2014

Related U.S. Application Data

(63) Continuation-in-part of application No. 12/970,880, filed on Dec. 16, 2010, now Pat. No. 8,613,536.

(60) Provisional application No. 61/288,269, filed on Dec. 19, 2009.

(51) Int. Cl.

| | |
|---|---|
| *F21V 13/14* | (2006.01) |
| *G02B 27/48* | (2006.01) |
| *H01S 5/40* | (2006.01) |
| *F21K 99/00* | (2010.01) |
| *H01L 27/15* | (2006.01) |
| *G02B 27/09* | (2006.01) |

(Continued)

(52) U.S. Cl.
CPC .............. *H01S 5/4025* (2013.01); *H01S 5/4012* (2013.01); *F21K 9/00* (2013.01); *H01L 27/156* (2013.01); *G02B 27/0905* (2013.01); *H01S 5/423* (2013.01); *G02B 6/4214* (2013.01); *G02B 27/0961* (2013.01)
USPC .............................. 362/553; 362/19; 362/235

(58) Field of Classification Search
USPC ............................ 362/553, 19, 235, 552, 259
See application file for complete search history.

(56) References Cited

U.S. PATENT DOCUMENTS

| | | | |
|---|---|---|---|
| 3,805,255 | A | 4/1974 | Baker |
| 4,127,322 | A | 11/1978 | Jacobson et al. |
| 4,448,491 | A | 5/1984 | Okubo |

(Continued)

FOREIGN PATENT DOCUMENTS

| | | |
|---|---|---|
| CN | 101558534 A | 10/2009 |
| DE | 102008030844 A1 | 12/2009 |

(Continued)

OTHER PUBLICATIONS

Warren et al, "Integration of Diffractive Lenses with Addressable Vertical-Cavity Laser Arrays", Sandia National Laboratories, Albuquerque, NM 87185, 1995; Conf-950226-38,Sand95-0360C; 1995; 11 pages.

(Continued)

*Primary Examiner* — Joseph L Williams
(74) *Attorney, Agent, or Firm* — Baker & Hostetler LLP

(57) ABSTRACT

Embodiments comprise laser emitter devices that generate a collimated beam of light the intensity or amplitude of which may be varied so as to carry data signals at a high rate of efficiency, and that is less sensitive to alignment of the detector, and detector systems for detecting the same collimated beam and reading the data carried in the beam of light.

32 Claims, 22 Drawing Sheets

(51) Int. Cl.
*G02B 6/42* (2006.01)
*H01S 5/42* (2006.01)

(56) References Cited

U.S. PATENT DOCUMENTS

| | | |
|---|---|---|
| 4,822,755 A | 4/1989 | Hawkins et al. |
| 4,827,482 A | 5/1989 | Towe et al. |
| 4,850,685 A | 7/1989 | Kamakura et al. |
| 4,870,652 A | 9/1989 | Thornton |
| 4,881,237 A | 11/1989 | Donnelly |
| 4,971,927 A | 11/1990 | Leas |
| 5,034,344 A | 7/1991 | Jewell et al. |
| 5,070,399 A | 12/1991 | Martel |
| 5,098,183 A | 3/1992 | Sonehara |
| 5,258,316 A | 11/1993 | Ackley et al. |
| 5,325,386 A | 6/1994 | Jewell et al. |
| 5,328,854 A | 7/1994 | Vakhshoori et al. |
| 5,420,879 A | 5/1995 | Kawarada et al. |
| 5,422,903 A | 6/1995 | Yamada et al. |
| 5,504,767 A | 4/1996 | Jamison et al. |
| 5,557,115 A | 9/1996 | Shakuda |
| 5,574,738 A | 11/1996 | Morgan |
| 5,581,571 A | 12/1996 | Holonyak, Jr. et al. |
| 5,640,188 A | 6/1997 | Andrews |
| 5,707,139 A | 1/1998 | Haitz |
| 5,758,951 A | 6/1998 | Haitz |
| 5,812,571 A | 9/1998 | Peters |
| 5,825,803 A | 10/1998 | Labranche et al. |
| 5,896,408 A | 4/1999 | Corzine et al. |
| 5,918,108 A | 6/1999 | Peters |
| 5,930,279 A | 7/1999 | Apollonov et al. |
| 5,976,905 A | 11/1999 | Cockerill et al. |
| 5,991,318 A | 11/1999 | Caprara et al. |
| 6,044,101 A | 3/2000 | Luft |
| 6,075,804 A | 6/2000 | Deppe et al. |
| 6,125,598 A | 10/2000 | Lanphier |
| 6,128,131 A | 10/2000 | Tang |
| 6,136,623 A | 10/2000 | Hofstetter et al. |
| 6,154,480 A | 11/2000 | Magnusson et al. |
| 6,167,068 A | 12/2000 | Caprara et al. |
| 6,215,598 B1 | 4/2001 | Hwu |
| 6,259,715 B1 | 7/2001 | Nakayama |
| 6,393,038 B1 | 5/2002 | Raymond et al. |
| 6,493,368 B1 | 12/2002 | Chirovsky et al. |
| 6,608,849 B2 | 8/2003 | Mawst et al. |
| 6,757,314 B2 | 6/2004 | Kneissl et al. |
| 6,775,308 B2 | 8/2004 | Hamster et al. |
| 6,898,222 B2 | 5/2005 | Hennig et al. |
| 6,943,875 B2 | 9/2005 | DeFelice et al. |
| 6,947,459 B2 | 9/2005 | Kurtz et al. |
| 6,959,025 B2 | 10/2005 | Jikutani et al. |
| 7,016,381 B2 | 3/2006 | Husain et al. |
| 7,126,974 B1 | 10/2006 | Dong et al. |
| 7,213,978 B2 | 5/2007 | Kuhmann et al. |
| 7,262,758 B2 | 8/2007 | Kahen et al. |
| 7,315,560 B2 | 1/2008 | Lewis et al. |
| 7,357,513 B2 | 4/2008 | Watson et al. |
| 7,359,420 B2 | 4/2008 | Shchegrov et al. |
| 7,385,229 B2 | 6/2008 | Venugopalan |
| 7,388,893 B2 | 6/2008 | Watanabe et al. |
| 7,393,758 B2 | 7/2008 | Sridhar et al. |
| 7,430,231 B2 | 9/2008 | Luo et al. |
| 7,444,041 B1 | 10/2008 | Chen et al. |
| 7,471,854 B2 | 12/2008 | Cho et al. |
| 7,613,215 B2 | 11/2009 | Kim |
| 7,680,168 B2 | 3/2010 | Uchida |
| 7,949,024 B2 | 5/2011 | Joseph |
| 2005/0025211 A1 | 2/2005 | Zhang et al. |
| 2005/0147135 A1 | 7/2005 | Kurtz et al. |
| 2006/0268241 A1 | 11/2006 | Watson et al. |
| 2006/0280219 A1 | 12/2006 | Shchegrov |
| 2007/0052660 A1 | 3/2007 | Montbach et al. |
| 2007/0153862 A1 | 7/2007 | Shchegrov et al. |
| 2007/0273957 A1 | 11/2007 | Zalevsky et al. |
| 2009/0141242 A1 | 6/2009 | Silverstein et al. |
| 2009/0284713 A1 | 11/2009 | Silverstein et al. |
| 2010/0265975 A1 | 10/2010 | Baier et al. |
| 2011/0002355 A1 | 1/2011 | Jansen |
| 2011/0176567 A1 | 7/2011 | Joseph |

FOREIGN PATENT DOCUMENTS

| | | |
|---|---|---|
| EP | 1024399 A1 | 8/2000 |
| JP | 2008-277615 A | 11/2008 |
| WO | WO 93/21673 | 10/1993 |

OTHER PUBLICATIONS

A. Gadallah. "Investigations into Matrix-Addressable VCSEL Arrays", Annual Report 2008, Institute of Optoelectronics, Ulm University; pp. 65-70.

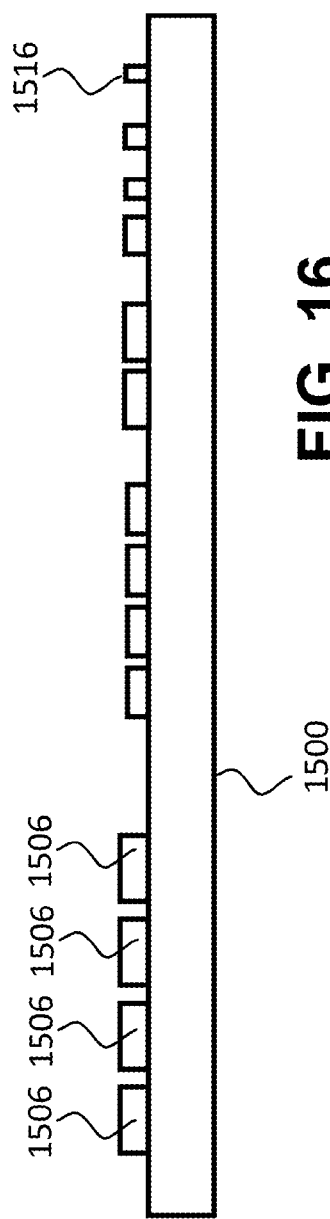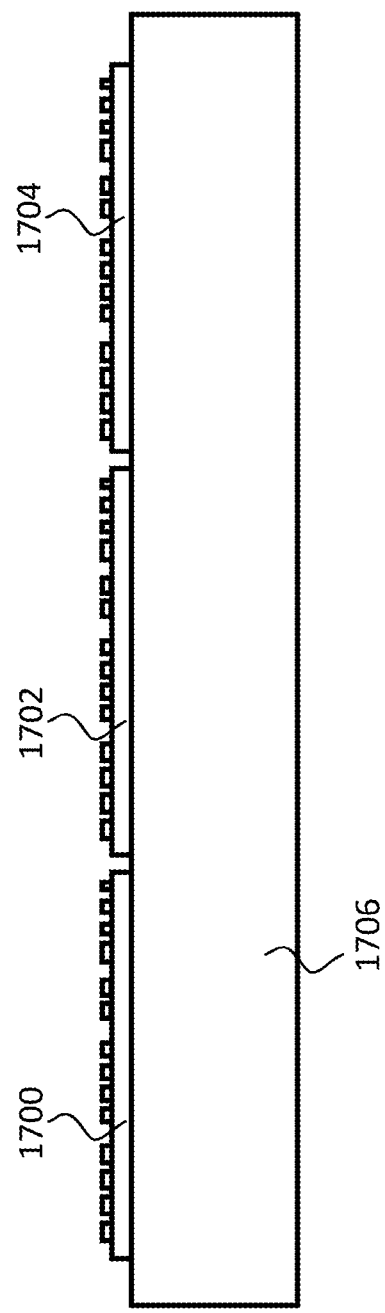

SYSTEM FOR COMBINING LASER ARRAY OUTPUTS INTO A SINGLE BEAM CARRYING DIGITAL DATA

CROSS REFERENCE TO RELATED APPLICATIONS

This application is a continuation-in-part of U.S. patent application Ser. No. 12/970,880, filed Dec. 16, 2010, which claims the benefit of U.S. Provisional Application No. 61/288,269, filed Dec. 19, 2009.

All of these applications are hereby incorporated by reference in their entirety.

TECHNICAL FIELD

The present disclosure is directed to laser emitter and detector systems.

BACKGROUND

Light has been used to create color intensity for displays, but the methods and the systems used are inefficient, bulky, and produce dim or non-scalable results. State of the art laser imaging displays have used lasers as intense color beams by utilizing various beam scanning apparatuses. In the case of lasers, display pixel output is generated from a combination of three beams of light: red, green, and blue. The three beams of light can be combined at various intensities to produce a particular color depth, intensity, and saturation.

In particular, the semiconductor laser has become important component of imaging system applications as the size, weight and power requirements of the semiconductor laser have decreased over time with its continued utilization. Semiconductor lasers have been used as the light sources for displays by delineating the light from the light sources into highly resolved intensity profiles which are used to create pixels. However, some existing techniques require the use of an analog power source variation while others rely on the use of timing and/or mechanical reflection means. The use of lasers as a light source also has the drawback of a scintillation effect, which produces light and dark areas of the spot or pixel.

Producing correct color semiconductor laser sources has only been possible with edge emitting semiconductor laser devices. However, this type of laser device is not conducive to photo-lithographically arrayed designs since they must be cleaved on edge to produce the cavity for lasing. Generally, the substrate is cleaved after fabrication. Consequently, this has limited laser display sources to single devices or mechanically ganged single devices.

The vertical-cavity surface-emitting laser (VCSEL) is a type of semiconductor laser diode with laser beam emission perpendicular from the top surface. In contrast, conventional edge-emitting semiconductor lasers emit from surfaces formed by cleaving the individual chip out of a wafer. While VCSELs offer advantages over edge-emitting lasers, VCSELs have not found use in imaging systems because VCSELs have only recently been created that are capable of producing the green output wavelength. While green output VCSELs have been created, these devices had extreme power requirements and a number of reliability issues. Materials research necessary to create other VCSELs capable of generating a better green output, as well as other color outputs, has progressed slowly. In fact, the blue VCSEL has only been commercially available for a few years.

VCSELs with external cavities (VECSELs) are a type of VCSELs that have been reconfigured to have the cavity extended outside of the wafer. VECSELs are optically pumped with conventional laser diodes. In addition, optical elements, such as non-linear crystals, can be used for doubling the frequency of the light and for allowing colored light output using the materials best suited for semiconductor laser fabrication.

Devices that use VECSELs, for frequency doubling output, in displays are designed to produce light sources in three distinct colors. This is in contrast to display devices, such as projectors, that use white light sources which are filtered to generate a particular color. Arrays of VECSEL devices are used to produce a single, bright, colored light source. The single colored light source is typically static, meaning that the intensity of the light source does not change. However, it is known that a mirror can be positioned among a plurality of mirrors to determine the color intensity at a point. Other known and related techniques include pulsing of the single light source or timing the light source to change intensity values. However, all of these methods are heavily dependent on mechanical mirrors. This technology is generally termed Digital Light Processor (DLP) technology.

DLP technology has dominated high quality display for a number of years. DLP technology is widely used in projection displays, along with many other different types of displays. DLP uses an array of Micro-electromechanical (MEM) devices as multiple tiny reflectors which can be modulated by electrical signals which reflect a specific amount of a colored light producing a combined color from 3 multiple color sources. These sources are generally colors filtered out of a white light source such as a costly projector lamp that uses a great amount of wasted energy that is not in the filtered wavelength. All this excess wasted energy produces large amounts of heat which make the system size much larger and more expensive in order to manage the thermal problem created by the excess heat.

VCSEL arrays have been arrayed and individually addressable for the purposes of parallel optical scanning and data transmission. Matrix addressable VCSELs have been previously used for imaging and data transmission, but are configured to use the devices in separately controllable means forming many individual devices driven independently. There have been other concepts suggested that use these separately controlled devices in an array to produce an image by varying the power source of each device to produce an intensity.

A summation of present techniques shows laser color formation for displays to be generated by adjusting the current source to make brighter or dimmer color intensities forming the pixel, or using laser arrays to produce a color source and reflecting or timing and scanning that source to produce the final intensity. All of these technologies require expensive, bulky, energy wasting technology and/or rely on mechanical mirrors, arrays of mirrors, and expensive supporting apparatuses to function.

BRIEF DESCRIPTION OF THE DRAWINGS

FIGS. 15, 16 and 17 illustrate alternative embodiments of linear arrays made up of sub-arrays of edge emitting lasers;

DETAILED DESCRIPTION OF ILLUSTRATIVE EMBODIMENTS

Figure 1:
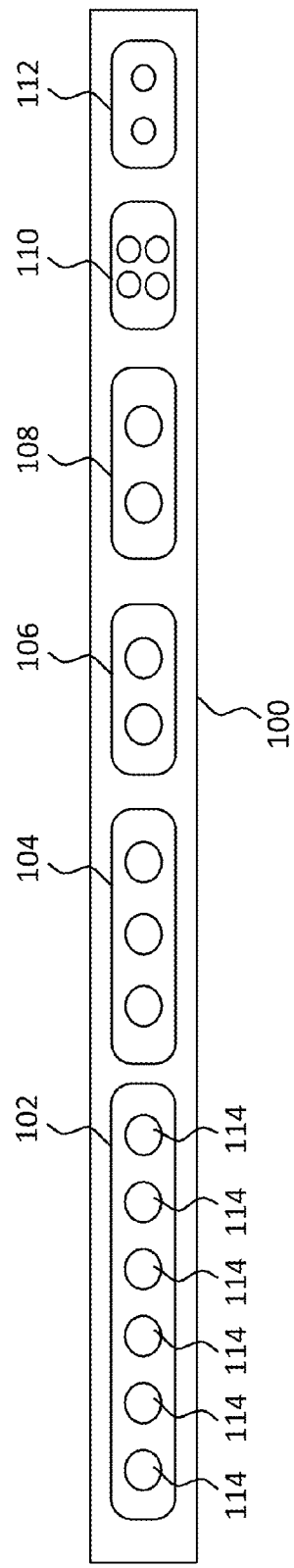
FIG. 1 illustrates a plan view of a linear VCSEL array organized into six sub-arrays of varying size and aperture in accordance with an embodiment.

Embodiments comprise a device that can efficiently produce a highly resolved intensity profile that can be easily switched to various specific configurations with binary strings. The binary strings define output intensities that are combined to form the color for a pixel. Arraying these devices allows an image line of pixels to be efficiently produced without gross scintillation effects. Non-coherent output is desirable in this application as it reduces scintillation effects on the screen or final image.

Embodiments that use VCSELs allow for a higher bandwidth due to the high power and frequency response of VCSELs. This further enables brighter images due to the combination of the output from many VCSEL elements forming the color for a single pixel. As will be further described below, embodiments also result in smaller fabrication sizes due to the photo-lithographically defined features of laser devices such as VCSELs and VECSELs. Embodiments also use less energy because only the colors needed are generated, without requiring filtering of white light. By using less energy, smaller cooling devices and other less expensive methods for cooling can be used enabling far smaller imaging systems. It is also to be understood that embodiments described herein can be used in a wide range of applications and fields, from display devices and projection systems to medical applications.

Embodiments minimize scintillation effects by using multiple out of phase, or incoherent lasers, to form one pixel. In addition, embodiments allow the use of a digitally defined current drive input. This eliminates the need for many, if not all, of the analog to digital elements and digital to analog elements of other imaging systems, resulting in smaller drive electronics.

It is to be understood that embodiments can be used to generate colors by combining wavelengths generated by laser devices. The laser devices corresponding to each wavelength are arrayed and mounted on a substrate, a chip, or some other circuitry. The output generated and the intensity of the laser devices is controlled with binary strings. Laser devices are arranged into groups or sub-arrays. Each sub-array is then mapped to a bit in a binary string, with the binary string containing image formation information.

It is also to be understood that embodiments herein will be described in terms of the red, green, and blue color space (RGB), with a first set of laser devices generating a red wavelength, a second set of laser devices generating a green wavelength, and a third set of laser devices generating a blue wavelength. These three wavelengths are combined to generate the color of a pixel. However, some embodiments may use only a single wavelength to generate pixel colors, while other embodiments may use three or more wavelengths to generate pixel colors. For instance, a first set of laser devices that generate a cyan wavelength can be combined with other laser devices that generate a magenta wavelength and a yellow wavelength. This would also enable pixel colors to be generated, with cyan, magenta, and yellow being the primary colors of the CYMK color model.

Embodiments operating at different wavelengths can be combined to form the true color, hue, and intensity value for a pixel. Each color source, comprised of laser arrays, can be housed within a single chip, with various chips being positioned close together in order to minimize the size of the color sources. The laser chips can be integrated to the drive electronics in flip chip packaging designs, resulting in reduced costs, improved performance, and reduced size and weight.

Although embodiments are described herein regarding linear arrangements of laser devices, many other physical combinations of laser devices are possible and may be preferred for some applications, such as in data communication devices. In contrast to the linear arrays and sub-arrays discussed below, which have particular application to imaging systems, the laser devices can be arranged in circles, stars, rounded clusters, triangles, squares and thousands of other shapes. For example, in a data communication application, it may be desirable to arrange individually addressable laser devices or addressable sub-arrays of laser devices in a circular manner so that one or more multiple laser beam components can be shaped to the environment in which they are being used, such as in combination with a rounded optical fiber. To simplify the description herein, however, linear arrays and techniques for addressing linear arrays and combining the output of such linear arrays will be discussed, but throughout, it should be kept in mind that the present invention is not limited to linear arrays of laser devices.

A first embodiment provides a multiple laser beam component for a pixel's color requirements in either one of the three primary colors of red, green and blue. The multiple laser beam component is comprised of an addressable 1D array of laser devices. The laser devices within a 1D array, or linear array, are grouped into one or more sub-arrays. The sub-arrays can vary in terms of the number of laser devices within each sub-array, and the sizes of the apertures of the laser devices. Each sub-array represents a partial color intensity for the color wavelength generated by the summation of all of the sub-arrays within a linear array. A binary, or a plurality of binary strings, depending on the implementation, contain the image information and are used to control the color intensities generated by the laser devices. In particular, a bit within a binary string contains the information for a sub-array of laser devices.

Each sub-array in the 1D array is controlled by the bit information supplied to the drive electronics for that sub-array. Each representative bit is part of a larger bit structure consisting of a binary or data string. By doubling the power or intensity of the combined apertures of each higher order sub-array, represented by the higher order digits in a binary encoding, a binary encoding can easily be applied to the entire linear or 2D array.

As noted above, all activated sub-arrays within a linear array are defined and simultaneously turned on by one binary string. The outputs from all activated sub-arrays, and correspondingly from all of the activated laser elements, in the one linear array are combined in the linear direction through an external optical system producing one non-coherent laser of a particular wavelength. The particular wavelength can be red, green, or blue, assuming the use of the RGB model. The one non-coherent laser is also combined with the other two color components, generated in the same manner, to create the color of a pixel. For example, a first non-coherent laser may produce blue, a second non-coherent laser may produce red, and a third non-coherent laser may produce green. The combined output of the non-coherent lasers produces a bright, full color, high bandwidth pixel with low to no scintillation effects due to the laser beams being out of phase and incoherent. A single linear array, or a plurality of linear arrays arranged on a single row, can be turned on simultaneously with a binary string, producing a vertical line of pixels of the image to be generated.

Embodiments incorporate multiple VCSEL devices grouped in different sized sub-arrays, as illustrated in FIG. 1. The sub-arrays form various intensity levels which correspond and are controlled to bits from a binary string. For example, if a linear array is made up of two sub-arrays, then the bit string "11" would imply that both sub-arrays are to be turned on. Similarly, the bit string "01" would imply that the first sub-array is to be turned off and the second array is to be turned on.

As noted above, the binary string describes how many and which sub-arrays are turned on in the whole linear array in order to combine all active beams of one linear array to produce accurate intensity for that pixel color. All sub-array beams making up one linear array, as shown in FIG. 1, or representing one binary word, are combined to form one of three colors that make up a specific pixel. Only one current drive is necessary to supply all elements of each sub-array by connecting all VCSEL devices in that sub-array in parallel. The binary bit in the binary string determines which sub-array is turned on, and all sub-arrays that are defined as on for that specific binary word are all turned on simultaneously for all three colors. Then all beams of the three linear arrays that are turned on simultaneously are combined with an anamorphic (cylindrical) lens to form one pixel.

The sub-arrays making up one color intensity are organized in a linear array of sub-arrays. A linear array can have any number of sub-arrays, and the corresponding controlling binary string can be adjusted accordingly in length to ensure that each sub-array is mapped to a bit from the binary string. Each linear array's output is combined with the outputs of two other linear arrays, generating the two other colors generated in the same manner, to form the final pixel's color.

Figure 2:
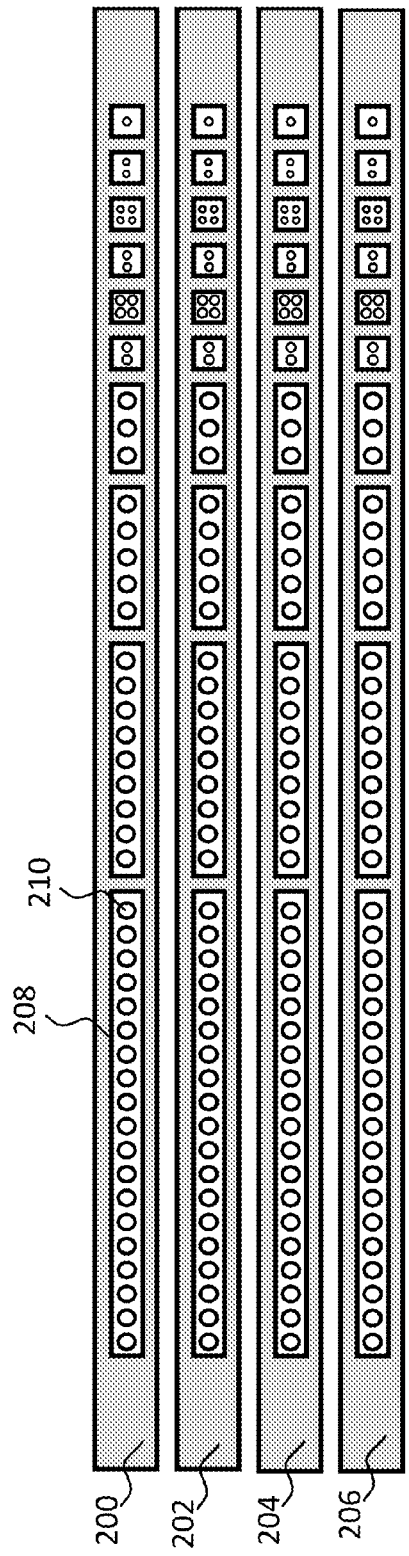
FIG. 2 illustrates a plan view of multiple linear VCSEL arrays organized into a 2D array in accordance with an embodiment.

One or more linear arrays can be arrayed in rows, forming a 2D array of sub-arrays and VCSEL devices as illustrated in FIG. 2. In a particular embodiment, all rows are linear arrays forming a 2D array. As submitted above, all the linear arrays that are used to produce one of the primary colors (i.e., red, green, or blue) are arranged on a single VCSEL chip. The VCSEL chips, with each chip corresponding to a different primary color, are aligned such that the linear arrays on one VCSEL chip are aligned with the corresponding linear arrays on the two or more other VCSEL chips, which results in the rows of all of the chips being aligned. For example, the first row from each chip would be aligned with the first row from the other two chips. The linear alignment of the linear arrays of all of the VCSEL chips allows all three linear arrays, or more if using more than three chips, that make up one pixel to be combined by the same anamorphic lens.

In an embodiment, all linear arrays on each row are turned on simultaneously. For instance, all the linear arrays on the first row are turned on simultaneously depending on the values in the binary string. Next, all the linear arrays on the second row are turned on simultaneously based on a different binary string. This subsequently continues for the remaining rows.

The binary string for each row can be concatenated with the binary string of every other row to form a single, one dimensional binary string. The number of sub-arrays within a row can be used to keep track of where a binary string for a particular row begins and where it ends. The single binary string can also include separators identifying where the string for a row begins and where the string for the row ends. The separator can be a numeric value, such as 2, −1, or some other number. The separator can also consist of a single character or symbol, such as a comma, an asterisk, a letter, etc., or a sequence of characters and symbols.

Alternatively, the binary string for each row can be kept separate from the binary string from every other row. In this case, the plurality of binary strings corresponding to the various rows can be organized in a list, a matrix, or in an alternative data structure.

Embodiments are not limited to using a sequence of zeros and ones to represent when a VCSEL sub-array is to be turned on and turned off. The key is to consistently use two different characters, with one character indicating that a VCSEL sub-array is to be turned on and when a VCSEL array is to be turned on. Thus, the binary string for a linear array would have a length equal to the total number of VCSEL sub-arrays within the linear array.

In an alternative embodiment, each bit within a binary string indicates whether an individual VCSEL within a sub-array is turned on and off independently of every other VCSEL within the same sub-array. For instance, for a sub-array having two VCSELs, the binary string "10" would indicate that the first VCSEL within the sub-array is to be turned on while the second VCSEL within the same sub-array is to be turned or left off. Hence, the binary string for a linear array would have a length equal to the total number of VCSELs within the linear array, rather than having a length equal to the total number of VCSEL sub-arrays within the linear array.

Embodiments described herein are applicable to any colored VCSELs and other semiconductor laser sources, as well as light emitting diodes (LEDs). Therefore, as new visible colored VCSELs and other semiconductor laser sources are developed and continue to mature, they can be used accordingly with embodiments described herein. In particular, as these respective technologies mature, they may be used instead of the frequency doubling described in some embodiments herein. In some cases, having technology that does not rely on frequency doubling may be preferable to remove the extra manufacturing costs associated with the non-linear crystal used for frequency doubling. In other cases, some wavelength do not need a non-linear crystal to be present.

Embodiments presented herein enable a device that can be used for data transmission by producing intensity modulation of a single or multiple pulses of a particular wavelength. Embodiments can also be used as a device having selectable intensities needed in the medical field, such as in delicate surgeries. For instance, many medical applications need an intensity modulation based upon data gathered by external sources.

FIG. 1 illustrates an addressable 1D array 100 of VCSELs including six sub-arrays 102, 104, 106, 108, 110 and 112. Each sub-array 102-112 is comprised of VCSELs positioned linearly, although not necessarily on the same line, in order to enable the combination of all sub-arrays 102-112 and their apertures, or beams, to be projected through a lens.

The length of the linear array 100 and the number of sub-arrays 102-112 within a linear array 100 can vary depending on the manner in which the linear array 100 is used and its application. Similarly, the number of VCSELs within each sub-array 102-112 can also be varied. This flexibility and variability in the design and composition of a linear array 100 of VCSELs allows for great power scalability, which is not found in other techniques.

Embodiments comprise a unique design which linearly combines a plurality of groupings of lasers. Each group from the plurality of groupings of lasers can vary from every other group in the number of apertures and the sizes of the apertures.

FIGS. 1-4 illustrate embodiments of single and multi-aperture VCSEL sub-arrays with suitable aperture arrangements for digital control of color depth based on the corresponding bit structures. FIG. 2 illustrates an example of a 2D array of linear arrays of VCSELs.

Embodiments described herein are based on a unique design that linearly or non-linearly combines lasers in groupings. The lasers within a group or sub-array can vary from the lasers in other groups or sub-arrays in terms of the number of apertures, the sizes of the apertures within the group, and the organization of the lasers in each sub-array. Each group or sub-array is represented and controlled by a bit from a binary string. However, in an alternative embodiment each laser within a sub-array is individually controlled by a bit within the binary string. However, in an alternative embodiment, each laser device within a sub-array is individually controlled by a bit within the binary string.

FIG. 1 illustrates a linear array 100 of VCSELS in accordance with an embodiment. The linear array 100 includes six sub-arrays 102-112. In an embodiment, the most significant bit from a binary string would correspond with the first sub-array 102, while the least significant bit from the binary string would correspond with the last sub-array 112. Alternatively, the binary string can be formatted such that the most significant bit corresponds to the last sub-array 112 and the least significant bit corresponds to the first sub-array 110. A binary string controlling linear array 100 would have a length of six. The binary string "111111" would result in all of the sub-arrays of linear array 100 being turned on, while the binary string "100001" would result in only the first sub-array 102 and the last sub-array 112 being turned on, with sub-arrays 104, 106, 108 and 110 being left off, i.e., turned off.

Each sub-array includes one or more laser apertures 114, illustrated in FIG. 1 only with respect to sub-array 102. As noted above, a single bit from the binary string can correspond to whether all of the apertures within a sub-array are turned on. Alternatively, a higher level of control can be achieved by having a single bit associated with a single aperture within each sub-array.

The apertures within a sub-array can have a different size than the apertures within a different sub-array. For example, the apertures within sub-array 108 are greater in size than the apertures within sub-array 110. Similarly, the apertures within a sub-array can be arranged into more than one row as long as each row is positioned along a line. For example, sub-array 110 includes four apertures, with two apertures positioned on a first row and the other two apertures positioned on a second row.

FIG. 2 illustrates a 2D arrangement of linear arrays of lasers in accordance with an embodiment. In particular, FIG. 2 illustrates four linear arrays 200, 202, 204 and 206. The sub-arrays 208 within each linear array are lined up vertically with the sub-arrays 208 of every other linear array, such that the first sub-array within the first linear array 200 is lined up with the first sub-array within the second linear array 202, and so on. The linear arrays are also lined up such that the apertures within each row line up vertically with the apertures within every other row. While FIG. 2 only illustrates four linear arrays, as many rows of linear arrays as necessary can be added in order to generate the necessary lines of an image.

Figure 3:
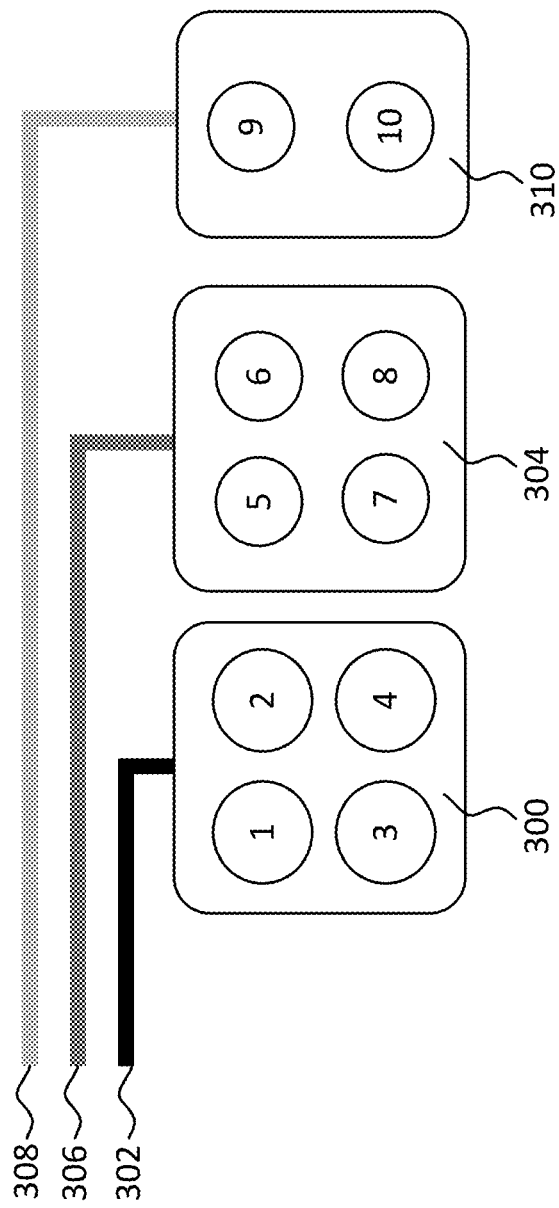
FIG. 3 illustrates a multi-aperture element VCSEL structure in accordance with an embodiment.

Each sub-array or sub-group is controlled by one power source due to the lasers within a linear array being connected in parallel. FIG. 3 illustrates a multi-aperture element structure in accordance with an embodiment, which allows flexible aperture sizes, aperture quantities, and a redundant light source. In particular, FIG. 3 illustrates a portion of a linear array in order to highlight how the apertures within a sub-array are connected in parallel to each other and are controlled by a single connection. The first sub-array 300, having apertures 1-4 connected in parallel, is controlled by connection 302. The second sub-array 304, having apertures 5-8 connected in parallel, is controlled by connection 306. Finally, sub-array 308, having apertures 9 and 10 connected in parallel, is controlled by connection 310. As has been noted above, a sub-array can consist of at least one aperture, and apertures within a sub-array can be arranged into a single row of apertures, or two or more rows of apertures. In addition, sub-arrays need not all have the same number of aperture rows. For example, sub-array 310 could have been arranged such that apertures 9 and 10 were positioned along the same row, rather than on two rows. The sub-array or element can have one device or more.

Figure 4:
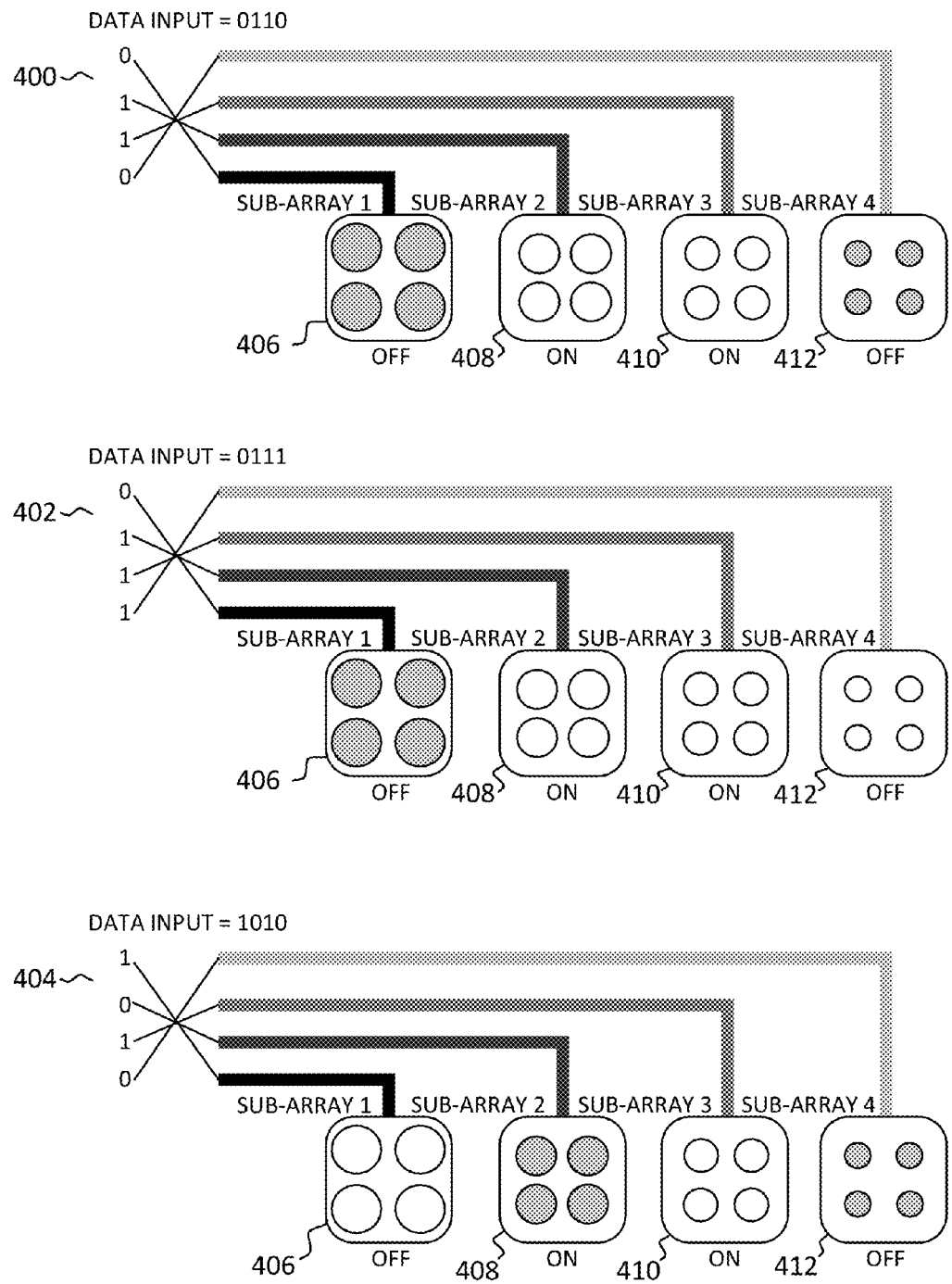
FIG. 4 illustrates three linear arrays of VCSELs controlled with a bit string in accordance with an embodiment.

FIG. 4 illustrates how three different binary string inputs control the groupings or sub-arrays within a linear array. The binary string, or data string, describes the color intensity for the color of one pixel. Specifically, the data string controls the sub-arrays within a linear array by controlling the input of current flow to a sub-array. If the apertures within a sub-array are all connected in parallel, then the entire sub-array will either be turned on or off based on the value of a single bit. The combined output of various sub-arrays according to the data string determines the color generated for a pixel. It is noted that alternative embodiments can consist of sub-arrays whose apertures are not connected in parallel. This alternative configuration enables each aperture within a sub-array to be controlled independently of every other aperture within a sub-array.

FIG. 4 illustrates three linear arrays 400, 402 and 404, forming three rows of linear arrays. Each linear array receives a bit string as an input. Each of the linear arrays has a first sub-array 406, a second sub-array 408, a third sub-array 410, and a fourth sub-array 412. The sub-arrays are turned on in each linear array according to its position in the array representing each bit of the word. For the first linear array 400, the data input is 0110, resulting in the first sub-array 406 being off (0), the second sub-array 408 being on (1), the third sub-array 410 being on (1), and the fourth sub-array 412 being off (0). As described in reference to FIG. 3, each sub-array is controlled by a connection line, with the apertures within a sub-array being connected in parallel to each other.

For the second linear array 402, the data input is 0111, resulting in the first sub-array 406 being off, and the other three sub-arrays 408, 410 and 412 being on. Finally, the third linear array 404 receives a data input of 1010, resulting in the first sub-array 406 and the third sub-array 410 being on, and the second sub-array 408 and the fourth sub-array 412 being off. The system can also be configured such that a zero represents being on and a one represents being off.

A plurality of linear arrays arranged on a single row, with each linear array from the plurality of linear arrays generating the color for a single pixel, can be combined to form a line of pixels with the correct color intensity for a first color (such as red). When the color intensity for two or more other colors, such as green and blue, are linearly aligned and combined with the output from the first color, the resulting output is a line of pixels for the image being generated.

As mentioned above, in embodiments the lasers within each sub-array are connected in parallel. Therefore, the connection shared by the lasers within each sub-array can be used as a thermal management heat sink component, allowing superior device performance to the improved thermal management.

The sub-arrays can be arranged from the largest number of apertures and the largest aperture sizes to sub-arrays with the smallest number of apertures and the smallest aperture sizes. Therefore, the most significant bit in a bit string would correspond to the sub-array that can generate the greatest color intensity for a particular wavelength (particular color). Similarly, the least significant bit would correspond to the sub-array that can generate the least color intensity for a particular wavelength. In FIG. 4, the first sub-array 406 has the same number of apertures as the last sub-array 412, but the first sub-array 406 has apertures with a larger size. FIGS. 1 and 2 also illustrate linear arrays where the first sub-array has more apertures and the apertures have a larger size than the last sub-array in the linear arrays. The size of each array in each Figure and the combination of laser devices, sub-arrays and arrays illustrated are just examples that help to explain the broader concept of embodiments. The present invention is not limited to any particular size, shape, type or physical arrangement of laser devices or any combination of laser devices, sub-arrays and arrays.

In a linear embodiment, the combined output from a single linear array, consisting of the combined output from each sub-array within the linear array, generates a portion of the final color or a pixel. That is, the combined output from a single linear array generates a first wavelength which is subsequently combined with two other wavelengths, with the final wavelength determining the final color of the pixel. For instance, a first linear array may generate a wavelength consisting of a shade of red. A second linear array may generate a second wavelength consisting of a shade of blue. Finally, a third linear array may generate a third wavelength of a shade of green. Once the three wavelengths are combined, they generate a final wavelength making up the final color of the pixel.

To ensure that the outputs from the various linear arrays, which are housed within VCSEL chips, are combined properly, the VCSEL chips must be positioned relevant to each other based on the optical design of the display device. As mentioned above, in an embodiment a red VCSEL chip generating a red wavelength, the red VCSEL chip may be positioned in line and next to a blue VCSEL chip generating a blue wavelength and next to a green VCSEL chip generating a green wavelength. The multiple parallel beams produced by the three VCSEL, or VECSEL, chips of different wavelengths are combined to form one highly resolved pixel of the correct color intensity.

While embodiments are described herein in terms of combining a red light, a green light, and a blue light, additional and alternative colors can be combined without departing from the spirit of the invention. For example, embodiments can combine and use any colors or wavelengths necessary based on the display or communications device design and requirements. In an alternative embodiment, one or more VCSEL chips, or alternative laser chips, fabricated with native wavelengths of red, green or blue can be used in combination with one or more VCSEL chip or laser chips needing to employ frequency doubling in order to produce the desired three or more colors to define the color intensity.

Embodiments described herein produce out of phase (incoherent) light. This is desirable when laser sources are used as light sources in order to reduce scintillation in the final image. Out of phase light ensures that the generated light waves do not interfere destructively with each other. However, alternative embodiments can also produce in-phase light.

While FIGS. 1-4 illustrate linear arrays arranged horizontally and forming a single row, alternative embodiments can consist of linear arrays arranged vertically and forming columns or non-linear arrays arranged in any combination of shapes. The rows of linear arrays are arrayed horizontally and turned on simultaneously to form a horizontal image line, but could be arrayed and turned in many other manners to produce different results.

In yet another embodiment, the linear arrays can be arranged both vertically and horizontally. For instance, a first set of linear arrays can be arranged horizontally, forming a first set of rows. A second set of linear arrays can then be positioned below the first set of rows but arranged vertically, forming a set of columns underneath the first set of rows. The spacing or position of a row of linear arrays is also determined based on the positions of the rows of linear arrays in the other chips housing the linear arrays that produce the different wavelengths.

Regardless of whether linear arrays are arranged horizontally by forming rows or arranged vertically by forming columns, image lines or communications matrixes can be formed by sequencing row by row (if arranged horizontally) or column by column (if arranged vertically).

A single linear array can also be used as the only line producing source. In such an embodiment, the output pixel intensity is scanned in both a vertical and a horizontal manner. The image to be display can also be formed by first scanning the horizontal component of the image information then sequencing to the next vertical position.

As noted above, embodiments allow the use of a digitally defined current drive input. This consequently simplifies all digital controlling circuitry used by the display device since there is no need for analog to digital circuitry.

Each of the linear arrays that make up a color intensity of the final color can have different numbers of sub-arrays. For example, the linear array that makes up the red wavelength component can consist of five sub-arrays, while the linear array that makes the green component and the linear array that makes up the blue component can consist of four sub-arrays. Alternatively, the number of sub-arrays can be the same in the linear arrays of each wavelength component, yet have a different number of apertures and/or different aperture sizes within the sub-arrays. Varying the structure of the linear array for each wavelength component can enable certain wavelengths, or color components, to have more power. For instance, if the linear array that generates the red wavelength has a larger number of sub-arrays, then the color red would tend to dominate the final pixel color.

Embodiments can use VECSELs for frequency doubling instead of VCSELs. Frequency doubling for the specific purpose of producing digitally representative VECSEL outputs in a visible color is a unique design even though it can be accomplished in a number of common arrangements known to those skilled in the art. One or more of the laser chips, or VECSEL chips that would need to be frequency doubled, can share a common non linear crystal element, thereby reducing manufacturing costs. Alternatively, one or more of the laser chips, or VCSEL chips, can be used with chip(s) or VCSEL devices that do not require frequency doubling.

In an embodiment, the device, or the VCSEL chip, housing the linear arrays will have the outputs of all apertures of the corresponding wavelength pass through a combination of optical elements. The selection of optical elements can include an etalon, a non-linear crystal, a combination of the etalon and the non-linear crystal, a beam splitter, a filter, a reflector, a lens, a mirror, or a combination of any of these optical devices. Passing the outputs of all apertures of a particular wavelength through the optical elements produces the desired color, wavelength, and beam properties of the laser or light source. Most importantly, the optical elements produce a second wavelength which is in the visible spectrum, the ultraviolet spectrum, the near infrared spectrum, or the far infrared spectrum, depending on the application.

Many different types of VCSEL chips or other types of laser devices can be used in embodiments of the present invention, including VCSEL using a flip chip technology to contact drivers, to align the VCSEL or laser chips to each other, or to mount the chips onto a carrier substrate. The use of flip chip technology for high speed VCSEL arrays is described in U.S. Pat. No. 7,949,024, which is incorporated herein by reference in its entirety. VCSEL chips that are mounted on or flip chipped onto a carrier substrate have openings or windows in the carrier substrate that allow the laser beams to emit through the substrate.

Figure 5:
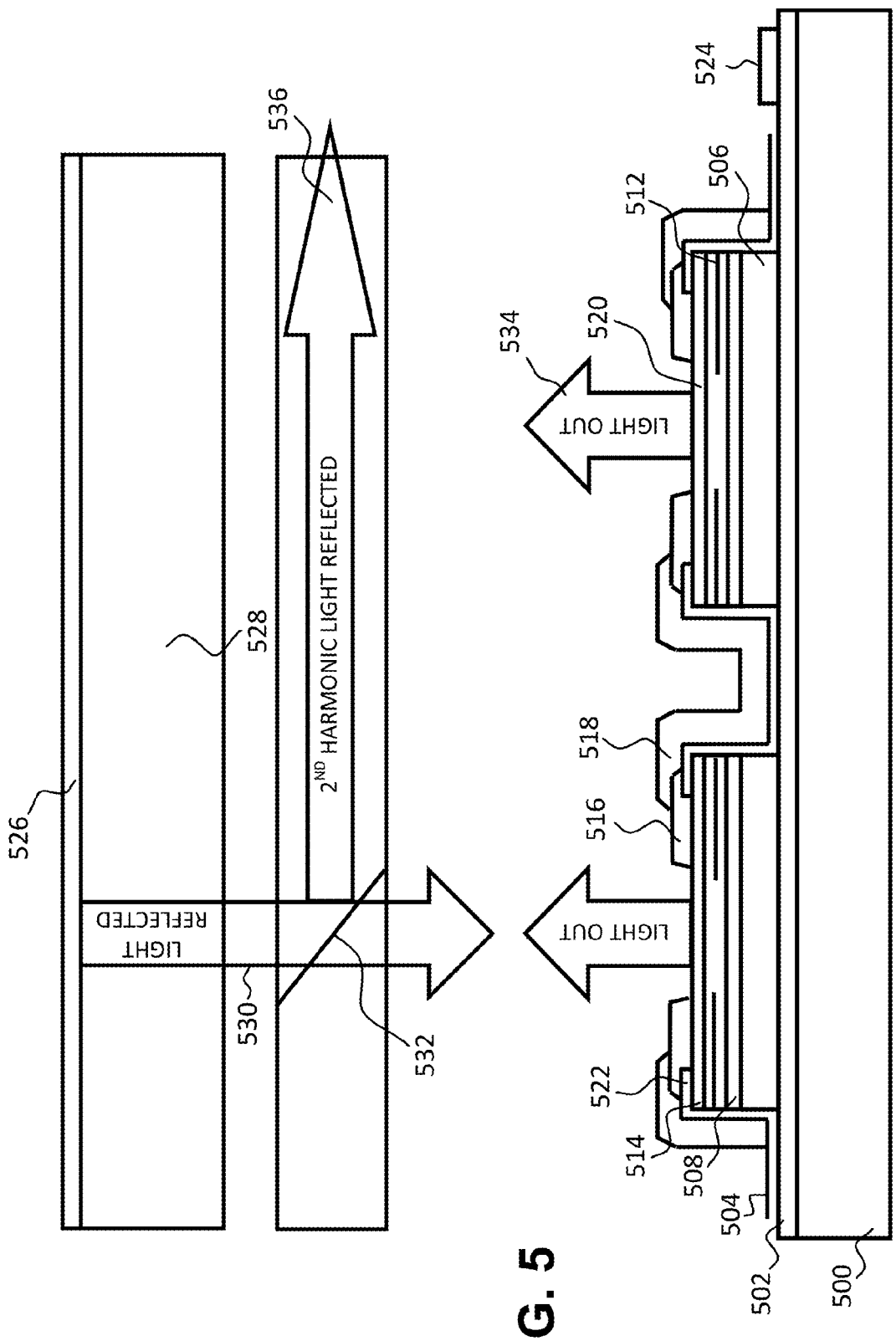
FIG. 5 illustrates a VCSEL device structure using a top emitting design in accordance with an embodiment.

VCSEL chips or other chips housing the linear arrays can consist of the typical top emitting design as shown in FIG. 5. The matrix addressable lines are fabricated on the light emitting chip with the sub-array connections and are mounted on, or flip chipped, to a active or inactive heat sink substrate.

Varying the current flow of the light sources can be used, depending on the design requirements, to generate higher power or lower power, which consequently can vary the generated intensity levels of the colors. Varying current flow, along with the customization of the apertures within a sub-array, can be used to vary the power intensity generated by sub-arrays.

Varying the current flow of the light sources can also be done in more than one level to achieve the desired or needed power and intensity levels for each sub-array. For example, rather than using a large number of sub-arrays, a smaller number of sub-arrays driven at two or more different current flows can yield the same color intensities that would be possible with the use of a larger number of sub-arrays. Not all of the sub-arrays within a linear array need to be driven at two or more different current flows. For example, if a linear array includes four sub-arrays, then depending on the design requirements, it may only be necessary to drive the sub-array at two different current flows.

FIG. 5 illustrates a VCSEL device structure using the top emitting design and showing common optical components in accordance with an embodiment. In particular, FIG. 5 illustrates the use of a beam splitter/wavelength filter, a non-linear crystal for frequency doubling, and a reflector for completing the cavity. The second harmonic light generated by the frequency doubling crystal is filtered, reflected, and emitted at a 90 degree angle from the incident beam.

In FIG. 5, the substrate 500 can be an N-doped Fallium Arsenide (GaAs) substrate, which is commonly used for epitaxial growth. The substrate 500 should be preferably chosen to avoid defect densities related to epitaxial growth on doped substrates. However, semi-insulating substrates can also be used with either a top emitting design or a bottom-emitting design (as further illustrated below).

Next, a common epitaxial design can be employed that can generally start with a heavily doped n-contact layer 502. However, it may also be desirable to position the n-contact layer closer to the substrate cavity, which would not have much of an effect on the final design. Positioning the n-contact layer closer to the substrate cavity can also improve the design of the device by not having to etch or implant deep into the substrate.

In the typical epitaxial design, a mirror 506 or Distributed Bragg Reflector (DBR) can be grown first. In the case of the top emitting embodiment, this mirror can have a reflectance greater than 99%. This epitaxial layer can be required to be doped for current conduction if the n-contact layer is grown on the substrate or if the n-contact layer is grown on the buffer layer which is subsequently grown on the substrate. In an alternative design it might be necessary, or desired, to grow the n-contact layer closer to the active region, and in that case an un-doped or low doped mirror can be used under the n-contact layer.

The mirror or reflector 506 can be designed as a DBR so as to have varying layers of differently composed materials. These materials can include GaAs, Aluminum Fallium Arsenide (AlGaAs), or other material compositions having different indexes of refraction that allow reflectance of the generated light due to the index of refraction contrast in the differing material. The thicknesses of the varying layers can also be designed based on the generating or emitting wavelength of the device. It is not in the scope of this invention to detail the complex designs of these layers. However, the description herein will illustrate, in sufficient detail to enable a person of ordinary skill the art to practice the invention, the most likely epitaxial growth patterns or components. It is not necessary to include details pertinent to the indexing of layers, barriers, or current spreading layers, as a person of ordinary skill in the art would be able to design and pick pertinent layers based on the design necessary for device operation. The use of these layers is common to VCSEL design and is well known in the art.

Next the epitaxial growth includes the active region 508 with cladding layers and any number of quantum wells.

Quantum wells are layers that have band gaps for the production of photons at specific wavelengths as the current passes through them. Many material compounds can be used including Indium Gallium Arsenide (InGaAs), InGaAp, and other materials common and uncommon to VCSEL or epitaxial design. These layers are also common to VCSEL design and are well known in the art.

Next the epitaxial layers to produce the top mirror component 514 are grown of the same or similar type of composite as the bottom mirror or DBR 506 previously discussed. The mirror reflectance is much less in the growth and is dependent on the design of the external reflector being used to complete the cavity. In the top DBR mirror 514, or even in the bottom DBR mirror 506, the designer can add a higher percentage of Aluminum to form a current confinement aperture 512. When this layer or layers are exposed to heated water (H2O) and nitrogen (N2) in an enclosed environment, commonly known in semiconductor laser processing as oxidation, the material in this or other similar layers on the outside edge of the mesa (formed by etching) will oxidize and change to some form of the dielectric composition of Aluminum Oxide (AlO2). This subsequently creates a ring of dielectric on the outside of the device forcing the current path to move to the middle of the device, thus creating an aperture. High current densities can then be achieved to produce enough photons or gain for lasing.

The last general component consists of the top contact 516. The top contact 516 can be heavily P-doped and designed to produce good ohmic top contacts 516. The top contacts 516 are deposited during processing and after wafer growth.

The final layer of the top emitting design can be made of a common thick GaAs layer, or other common compound, for formation of a lens 520. The lens 520 is needed to reduce and control the divergence of the emitted beam. The lens 520 can also be designed in the top mirror 514 with oxidized layers. However, alternative embodiments may not use the lens 520.

While FIG. 5 describes a particular embodiment of epitaxial components for a top emitting laser design, other layers or designs common to semiconductor laser processing can also be used.

In a particular embodiment, the process followed to fabricate embodiments is as follows. After proper cleaning of the grown epitaxial wafer, the epitaxial wafer is coated with photo-resist. Both a thick positive resist and a negative resist can be used to coat the epitaxial wafer. Next, the added resist layer can be patterned with a mask by exposing the resist layer to ultraviolet light or by exposing the resist layer to a patterned electron beam, depending on the resist layer used. The pattern leaves a round or square mesa of photo-resist with a thickness of about 3 microns in order to last or hold up in the plasma etch chamber and process. The plasma etch is commonly a Chlorine (Cl2) or Boron Trichloride (BCl3) gas based etch or a mixture of common plasma etch gases for GaAs. Alternative processes can use chemical etching for the mesa formation. The etch process of the mesa is complete after etching through the active region but stopping in a highly doped mirror or in the n-contact layer. Depth of the etch process can be controlled by a reflectometer, interferometer, or by end point detection using a residual gas analyzer (RGA). These techniques and processes are common to the semiconductor processing industry and are well known in the art.

Next the sample or wafer is exposed to the oxidation environment described earlier to form the current confinement layer. In another technique the current confinement can be achieved by masking the devices and implanting. These techniques are common to the semiconductor processing industry and are known in the art.

At this point the lens etch can be accomplished by patterning photo-resist or a photo definable polymer, reflowing the resist or polymer, and then plasma etching by using an etch generally having a low selectivity. Using an etch with a low selectivity enables the reflowed lens shape to be transferred into the etched GaAs, AlGas, or other composite material to form the lens 520. This etching process can also be performed before the oxidation of the device.

After cleaning off the resist mask, a dielectric deposit 504 is formed over the entire surface. This layer can be designed in combination with other deposits to form an antireflection coating over the aperture, as well as according to the wavelength of the device and the other optical elements or components. SiN2 or any similar material with dielectric properties can be used. These layer types are generally deposited by plasma enhanced chemical vapor deposition (PECVD).

Next, another photo-resist is patterned over the sample or wafer and exposed to open the dielectric layers for formation of the contact layers. The patterned wafer is subsequently exposed to another plasma etch, generally composed of a fluorine based gas, or fluorine based gas combined with some other etch gases. Alternative etch gases can also be used. After the etch is complete, the mask is removed by first cleaning in solvents, and then cleaned by using de-ionized water.

In the following step, another photo-resist is patterned over the sample or wafer and the photo-resist is exposed to form an opening in the resist. It is in this opening where the p-metal contact 516 is deposited on the heavily P-doped epitaxial layer designed for P-ohmic contacts. This resist is commonly a negative resist that can be patterned to have a retrograde resist sidewall in order to "lift-off" the metal that is not part of the opened area. Alternative resist processes can be used for the lift off step. The techniques are common to the semiconductor processing industry and are well known in the art.

A plating process is used to form heat sink material 518 around the mesas. The heat sink material 518 is used for thermal management and also to connect other mesas within a sub-array together to form a parallel contact.

Other dielectrics may be applied and or etched back to expose and form connections, contacts, and pad metals for flip chipping and for optical coatings or protective layers for the device. These dielectric coatings are a common process known in the art.

The connections for the different sub-arrays can be deposited in the same manner as described above for the metal layers and the pads for flip-chip bonding. These steps can be in any order to deposit these connection forming layers.

Finally, a final deposit of solder 524 may be needed to form the flip chip balls or contacts for the flip chip process. This final deposition is commonly a plating deposition, but it can also be an evaporative deposition technique. The solder layer is composed of soft metal composites like Tin, Indium, other suitable metals, and combinations of metals such as Gold (Au) or Silver (Ag). This process might not be necessary if it is accomplished on the substrate carrier or heat sink.

The steps presented above are used for the processing of the wafer of VCSEL laser chips. The following steps describe an example of a back-end or packaging process in accordance with an embodiment.

First, the wafer can be cleaved or diced with a semiconductor saw to yield the appropriate sized completed chips. The VCSEL laser chip or die can be mounted to the carrier substrate by aligning the chips or aligning the heat sink. The chips can be aligned with infrared backside chip alignment techniques, as is well known in the art of bonding and photolithography. Alternatively, the heat sink can be aligned by flip chipping or other means of alignment and attachment. In some cases, after bonding, the native substrate could be removed for better device performance.

After aligning one chip, the next two or more chips are bonded to the carrier substrate. The carrier substrate is processed to have the drive circuitry and flip chip connection pads, along with any other circuitry necessary for the operation of the laser device. The carrier substrate can also be processed with a deep Silicon (Si) etch tool or in a chemical etch in order to create the windows or openings with which the lasers are aligned for propagation.

Next, the non-linear component or crystal (illustrated in FIG. 11, crystal 1114) is patterned with metal and solder contacts near the edge in order to match solder pads on the carrier substrate. This allows attachment by bonding to the substrate. In addition, this technique is ideal for planarity, which is always a concern when an external mirror is a component of the laser cavity. The non-linear crystal can cover one or more of the chips for frequency doubling. In some embodiments, the non-linear crystal can be used for frequency quadrupling, frequency adding, or frequency subtracting, depending on the application.

Figure 11:
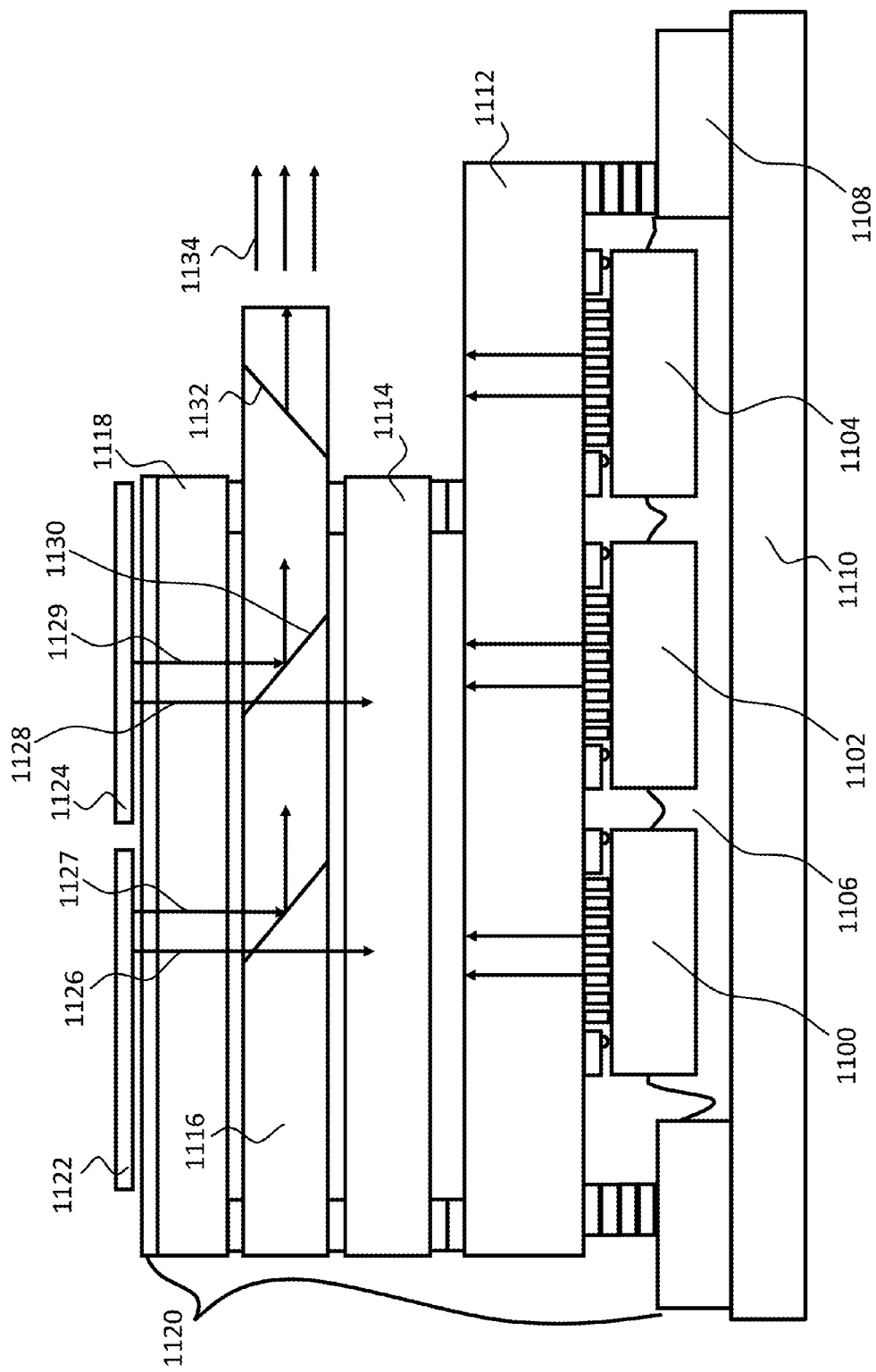
FIG. 11 illustrates a top emitting arrangement where the wavelengths are doubled in an intra-cavity design by the use of a non-linear crystal.

As submitted above, other optical elements can be added for improving the efficiency of converting the native wavelength to a frequency doubled wavelength. Suitable optical elements include polarizing beam splitters, filters, etalons, or wavelength control optical components. FIG. 11 illustrates how various optical elements can be incorporated. Polarizing beam splitters or beam combiners 1116 are patterned with metal and solder contacts near the edge in order to match solder pads on the non-linear substrate. All other elements in the optical design can be similarly mounted, allowing attachment by bonding to the substrate. Bonding is accomplished by a heat and pressure process common to the industry.

Returning now to FIG. 5, native wavelength 534 is generated by the device and propagates through the polarizing beam splitter element 532 and continues in the optical cavity 528 to be reflected by the appropriately designed reflector 526. As the beam propagates 530 back through the beam splitter 532 the frequency doubled component 536 is reflected out at a perpendicular direction from the cavity.

In particular embodiments, the VCSEL, laser chips, or other light sources can be fabricated with red, green and blue native wavelengths without frequency doubling.

In yet another embodiment a single linear array can be used to produce all pixels. These linear arrays can be used to produce each pixel and scanned in a two direction scanning process.

Embodiments are not limited to using VCSELs. In an embodiment, single surface emitting lasers (SELs) can be used within a sub-array. A linear array can consist of a combination one or more sub-arrays having SELs and one or more different sub-arrays having other types of lasers.

In yet another embodiment, the VECSEL chips can be mounted on a substrate for alignment to each other with laser apertures pointing up and not needing the previously mentioned window or opening. Alternatively, the VECSEL chips or light emitters can be mounted on the substrates, with the emitted wavelengths or beams not propagating through said substrate, carrier substrate, and the heat sink active or passive.

Both top emitting VECSEL chips and bottom emitting VECSEL chips can be used in embodiments. The VECSEL chips can be mounted on flip chipped to a heat sink substrate having the matrix addressable lines fabricated in the substrate.

The matrix connections of the P-contact layer, the N-contact layer, or both, can be fabricated on a heat sink substrate for direct flip chip bonding to each appropriate pad.

As noted above, sub-arrays can consist of a single laser. For example, a linear array can be comprised of one or more sub-arrays, with the single aperture within each sub-array being sized accordingly based on the position of the bit it represents. The first sub-array can consist of a single aperture having the largest size. The second sub-array can consist of a single aperture but having a smaller size. The last sub-array, corresponding to the least significant bit, can consist of a single aperture with a size smaller than the aperture size used in any of the other sub-arrays. A linear array can also consist of one or more sub-arrays, with each sub-array having a single aperture having the same size as the aperture of every other sub-array in the same linear array.

Figure 10:
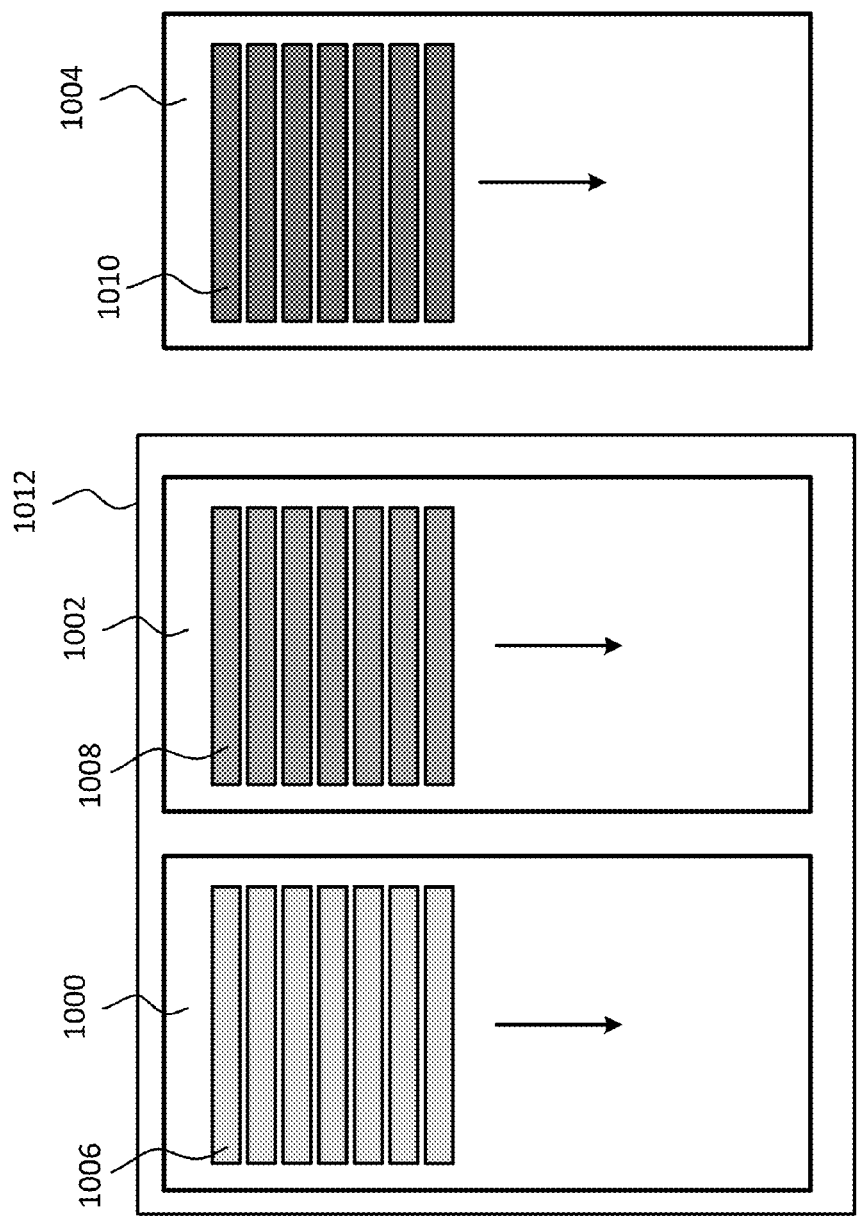
FIG. 10 illustrates three separate 2D array chips used to generate three color components of a pixel.

FIG. 10 illustrates three separate 2D array chips 1000, 1002 and 1004 used to generate three color components of a pixel. For instance, array chip 1000 can correspond to the red color component, array chip 1002 can correspond to the green color component, and array chip 1004 can correspond to the blue color component, or each can correspond to any of a number of different colors as an application requires. Row 1006 from the chip 1000 component, row 1008 from the chip 1002, and row 1010 from the chip 1004 are aligned to each other in order to combine the three color components, with one color component generated by each chip, necessary to produce the final correct color hue and intensity of the pixel. The remaining rows of the chips 1000, 1002, and 1004 also are aligned. However, chips 1000 and 1002 are mounted on carrier substrate 1012, while chip 1004 is not. Thus, the positioning of light sources or chips must also take into consideration the specific optical path of the chips, the lens position, the circuitry of the display device, and any other structure relevant to the entire display device.

Figure 14:
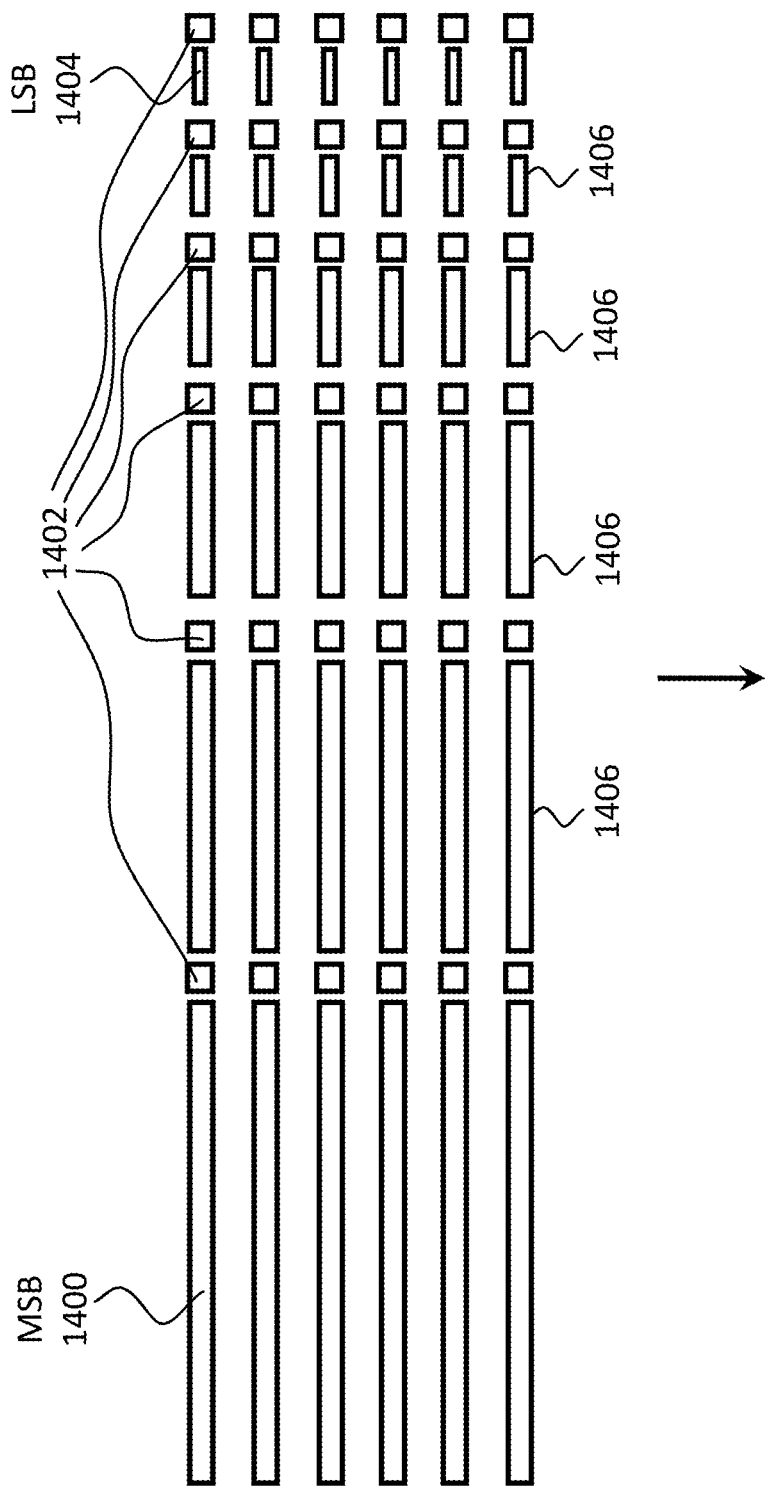
FIG. 14 illustrates a design in accordance with an embodiment using edge emitting lasers.

In another embodiment an edge emitting device, such as an edge emitting laser or an edge emitting Light Emitting Diode (LED), can be fabricated as illustrated in FIG. 14. FIG. 14 illustrates a design in accordance with an embodiment using edge emitting lasers starting with the (Most Significant Bit) MSB laser 1400 and ending with the (Least Significant Bit) LSB laser 1404, with any of a number of other laser devices 1406 in-between. The output of each sub-array is combined and emitted by the vertical outputs 1402. In particular, in the embodiment from FIG. 14 the lasers or LEDs can be designed for corresponding higher power sub-arrays by using different strip lengths or widths to vary the power. Alternatively, multiple devices can be contacted together in parallel to form sub-arrays as described in reference to FIGS. 1 and 2.

In further reference to FIG. 14, a sub-array can consist of a single edge emitting laser (EEL) or a combination of EELs. The one or more sub-arrays within a linear array can all be comprised of EELs. Alternatively, one or more first sub-arrays can be comprised of EELs, while one or more second sub-arrays can be comprised of lasers having some other surface emitting beam devices. The sub-arrays can be designed such that the sub-array that corresponds to the MSB, and those sub-arrays close to the MSB sub-array, have a larger output than the sub-array that corresponds to the LSB, and those sub-arrays close to the LSB sub-array. These surface emitting type structures use vertical output components such as mirrors or gratings and can be used in the same manner as other embodiments described herein that use VCSELs. Embodiments that use EELs can also be used in a communications or data transmission application by using intensity modulation of each pulse. This would allow the typically slower EEL devices, which typically have a higher output power, to compete at a higher bandwidth for high power communication applications.

Figure 15:
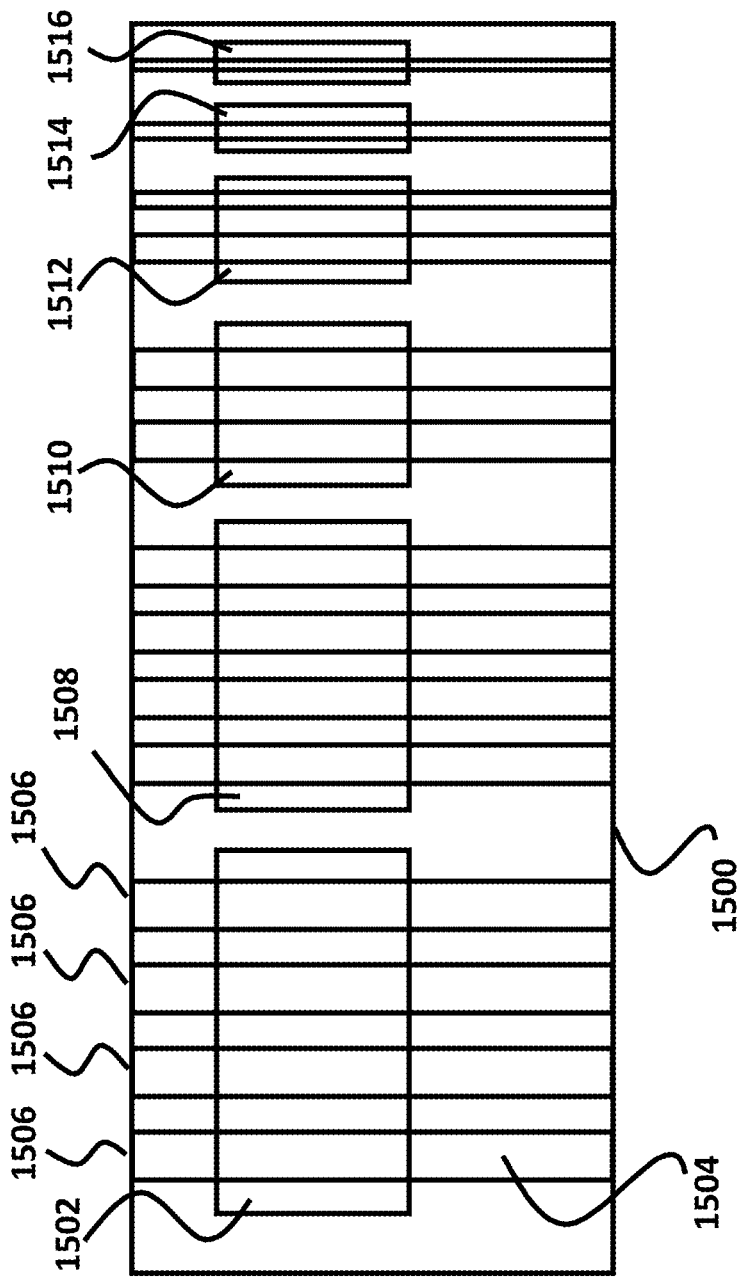

FIGS. 15-17 illustrate other embodiments of linear arrays made up of sub-arrays having one or more EELs. A single linear array can be comprised of one or more EEL sub-arrays and one or more sub-arrays housing other types of lasers. If various linear arrays are arranged on a single row, then a first linear array within the row can include only EELs while a second linear array within the same row can include other types of lasers.

In another embodiment, the 1D array is used as a single color pixel producing source combined with other sources of the same but different colors or wavelengths and the combined colors output pixel intensity is scanned in a vertical and horizontal manner. The laser chip could be fabricated out of edge emitting material with common fabrication techniques known to those skilled in the art. The arrays or single devices of varying power according to the digital binary system of outputs described above could then be cleaved and mounted to enable the same method of encoding the color intensity.

An embodiment can use flip chip technology and a design for high speed arrays with a waveguide being formed around each sub-array or element as described in U.S. patent application Ser. No. 12/707,657, which is incorporated herein by reference. In particular, a ground plane substantially or completely surrounds all of the laser devices within a sub-array, forming a coplanar waveguide lead. The use of the waveguide can significantly increase the bandwidth of VCSEL arrays and enable embodiments of the arrays disclosed herein to be utilized for many different applications aside from imaging systems.

Embodiments can use any variety of semiconductor lasers, apertures, and light sources, including light-emitting diodes (LEDs), resonant cavity LEDs, edge emitting lasers, and all classes of semiconductor lasers such as VCSELs, VECSELs, or any semiconductor laser within the vertical emitting variety with perpendicular laser propagation to the wafer substrate surface. Other light sources can also be used as a source of light for a particular color or for a combination of colors. Alternative light sources can also be arranged linearly in sub-arrays as disclosed herein, with each sub-array associated and controlled by a bit from a binary string containing information for an image to be formed. These other light sources can include LEDs, organic LEDs, optically pumped light sources, and electrically pumped light sources, among others.

For instance, a particular embodiment can be comprised of linear arrays of LEDs of one or more similar colors. If LEDs are used, then frequency doubling of wavelength is not necessary, thereby eliminating the complex optical system needed for frequency doubling.

Edge emitting laser diodes with vertical outputs can also be combined in linear arrays, with sub-arrays, with the linear arrays having a power intensity corresponding to the bit position a sub-array represents. In an embodiment using edge emitting laser diodes, the linear design or strips making a single laser can be positioned parallel to the direction of the linear array. The outputs can be positioned to combine all the beams with an anamorphic lens or a similar device. For instance, FIG. 14 illustrates the MSB sub-array 1400, LSB sub-array 1404, and sub-arrays 1406 linearly arranged. The beams from these linear arrays are combined by the corresponding vertical output 1402, which can be an anamorphic lens.

Linear arrays of edge emitting devices can be designed such that the linear arrays has sufficient room along one direction, typically the x-direction, to position multiple stripped lasers with vertical output. An example is illustrated in FIG. 15. The sufficient room along one direction enables these edge emitting lasers to have varying lengths and/or varying widths to produce the intensity for the corresponding bit from that binary string that it represents.

FIG. 15 illustrates a top view of an embodiment of an edge emitting array formation 1500, where an edge emitting laser or an edge emitting LED are fabricated and used instead of the surface emitting orientation of laser devices described above. The chip illustrated in FIG. 15 shows a first sub-array 1502 using stripped edge emitting lasers, such as stripped edge laser 1504. When the laser 1504 is cleaved, the apertures 1506 are formed. The apertures 1506 are all controlled in parallel, with the intensity of the sub-array 1502 corresponding to the bit position it represents. The array formation 1500 further includes sub-arrays 1508, 1510, 1512, 1514, and 1516. In the array formation 1500, sub-array 1502 corresponds to the MSB while sub-array 1516 corresponds to the LSB.

FIG. 16 illustrates a side view of the edge emitting array formation 1500 from FIG. 15. From the perspective of FIG. 16, the propagation direction of the generated light would be perpendicular to the surface of the figure (coming out of the surface of the paper).

FIG. 17 illustrates arrays of edge emitting lasers that have been cleaved and mounted in order to produce digital output intensity from an edge emitting orientation rather than a surface emitting orientation. FIG. 17 shows chips 1700, 1702 and 1704 mounted on a packaging component 1706. In particular, each of the chips 1700, 1702 and 1704 are comprised of a linear array as illustrated in FIGS. 15 and 16. The chips are aligned with each other to ensure that the laser outputs from the three chips can be combined to generate the color for a pixel. An embodiment as illustrated in FIG. 17 has the advantage of not requiring frequency doubling components, consequently being easier to manufacture. As noted above, when using edge emitting lasers, the outputs can be combined by using an anamorphic lens.

As submitted above, the external mirror fabricated by deposition or depositions on a substrate, resulting in a DBR with properties matched to the specific wavelength of propagation, is patterned with metal and solder contacts near the edge in order to match solder pads on the non-linear substrate. This allows attachment by bonding to the substrate. Bonding is accomplished by a heat and pressure process well known in the art. The external reflector mentioned above can also be deposited on one of the other optical elements as illustrated in FIG. 6 where the external reflector 626 is deposited on the non linear crystal 628 to simplify the design.

FIG. 5 illustrates a typical VCSEL device structure using the top emitting design and showing common optical components, including a beam splitter/wavelength filter, a non-linear crystal for frequency doubling shift, and a reflector for completing the cavity. The second harmonic light generated by the frequency doubling non-linear crystal is filtered after traveling through the non-linear crystal. The non-linear crystal reflects at a 90 degree angle all wavelengths emitted initially by the VCSEL device, only letting pass harmonic wavelengths that were created by the non-linear crystal. When light is reflected at a 90 degree angle, the output beam is at the same incident angle from the output coupler as from the incident beam from the VCSEL. The output from the external reflector 526 can be combined with a bandpass filter to allow the harmonic wavelengths generated by the crystal 528 to pass while reflecting wavelengths generated by the light source.

Figure 6:
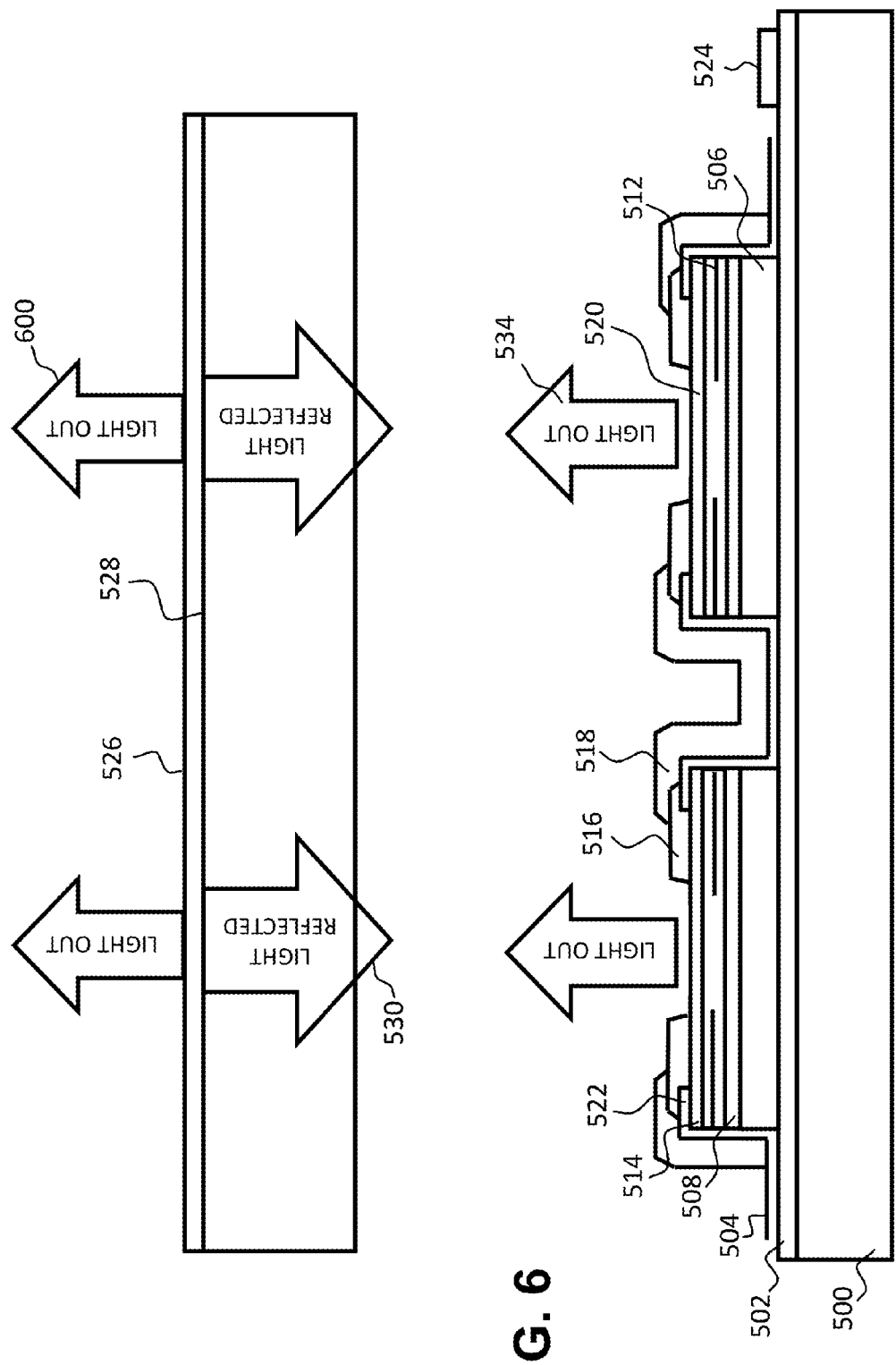
FIG. 6 illustrates a VCSEL device structure using a top emitting design in accordance with an embodiment.

The device illustrated in FIG. 6 can be fabricated following the same method used to fabricate the device from FIG. 5, except that the device from FIG. 6 does not include the beam splitter or other optical elements. In FIG. 6, the reflected beam 530 from the external mirror 526 returns to the cavity while the frequency doubled beam component 600 generated by the non-linear crystal is propagated through the appropriately designed mirror 526 incident or perpendicular to the surface of the non-linear crystal.

Figure 7:
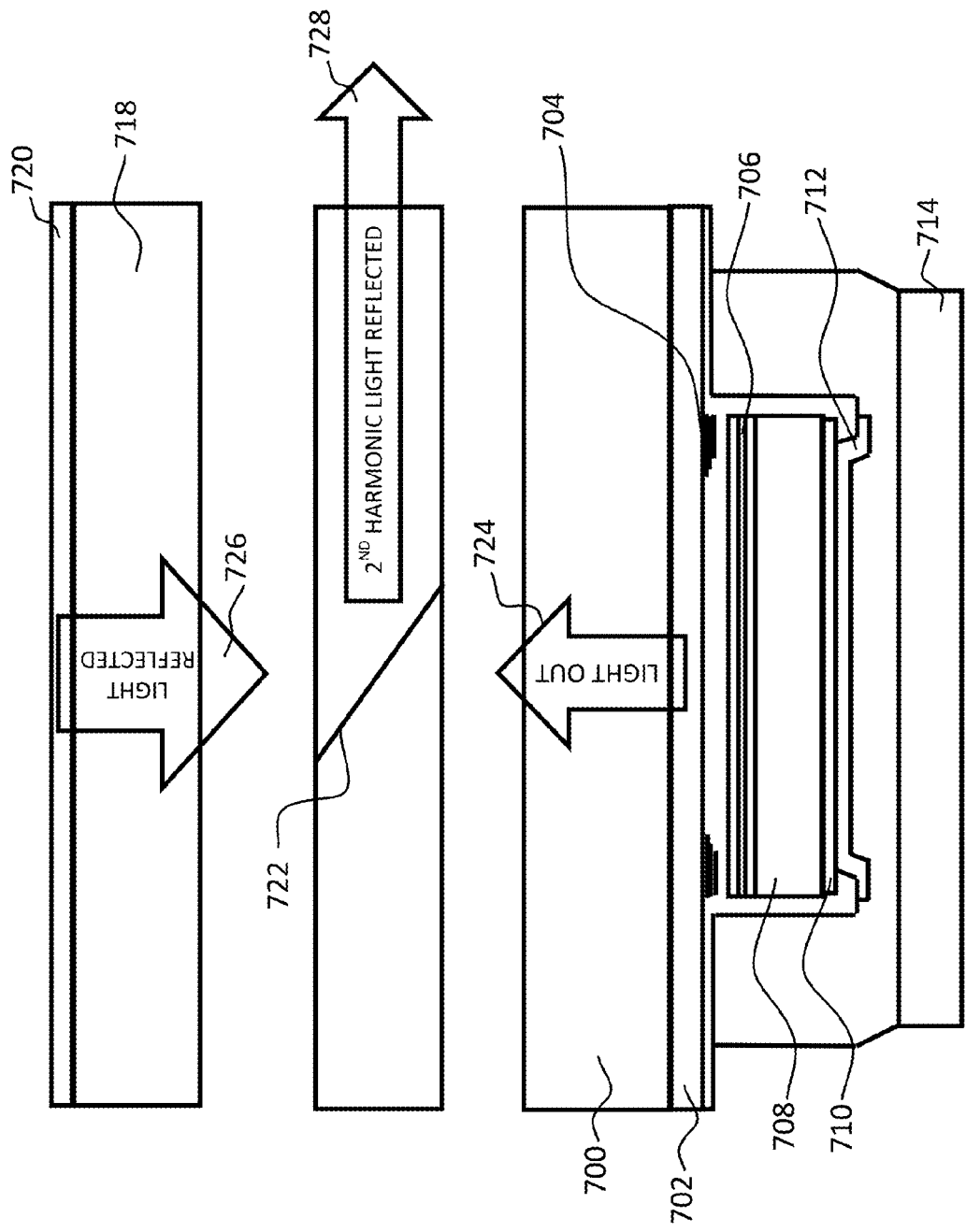
FIG. 7 illustrates a VCSEL device structure using the bottom emitting design and showing optical components of a beam splitter/wavelength filter, a non-linear crystal for frequency doubling, and a reflector for completing the cavity.
Figure 8:
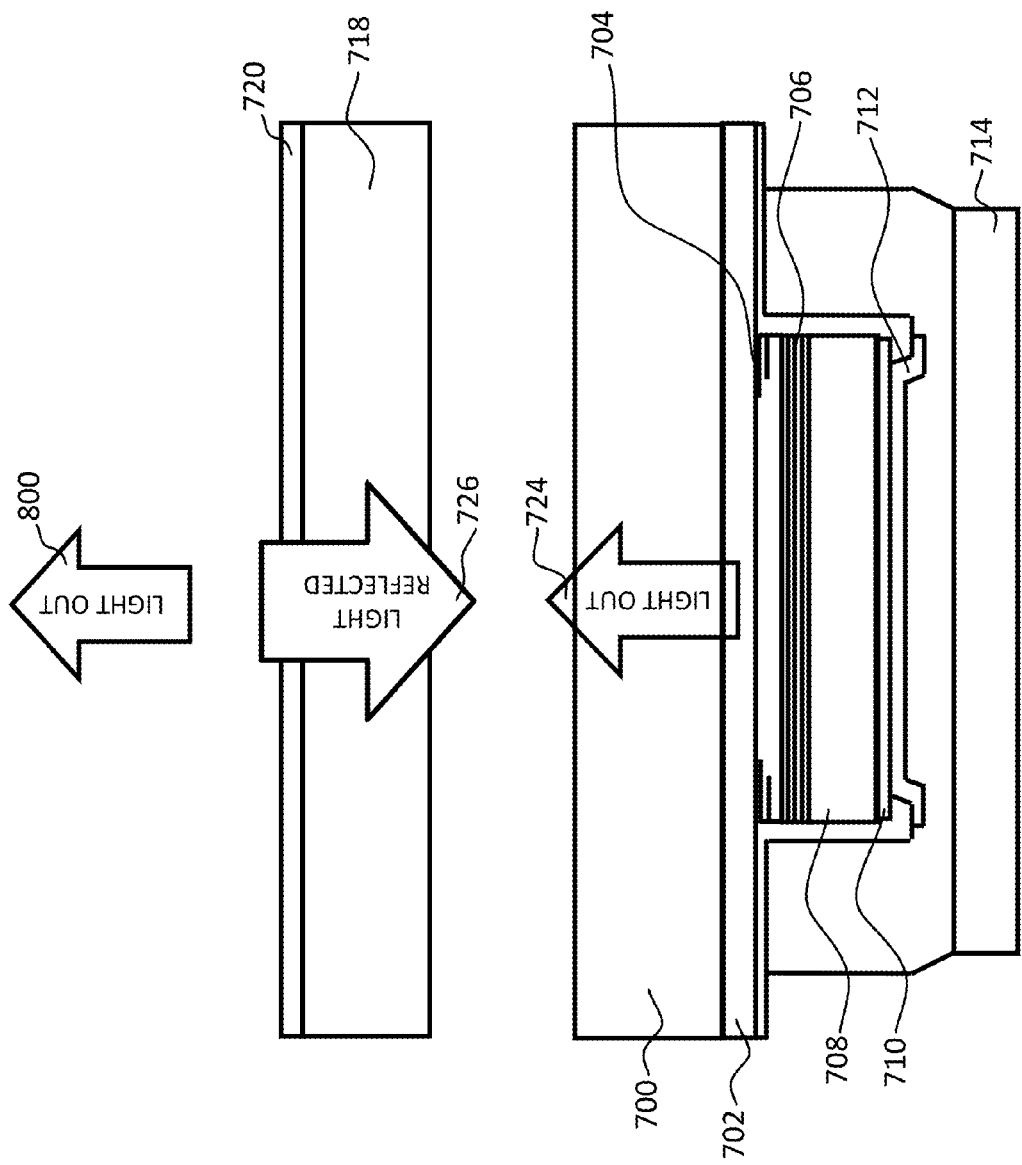
FIG. 8 illustrates a VCSEL device structure using the back emitting design and showing optical components of a non-linear crystal for frequency doubling and a reflector for completing the cavity.
Figure 9:
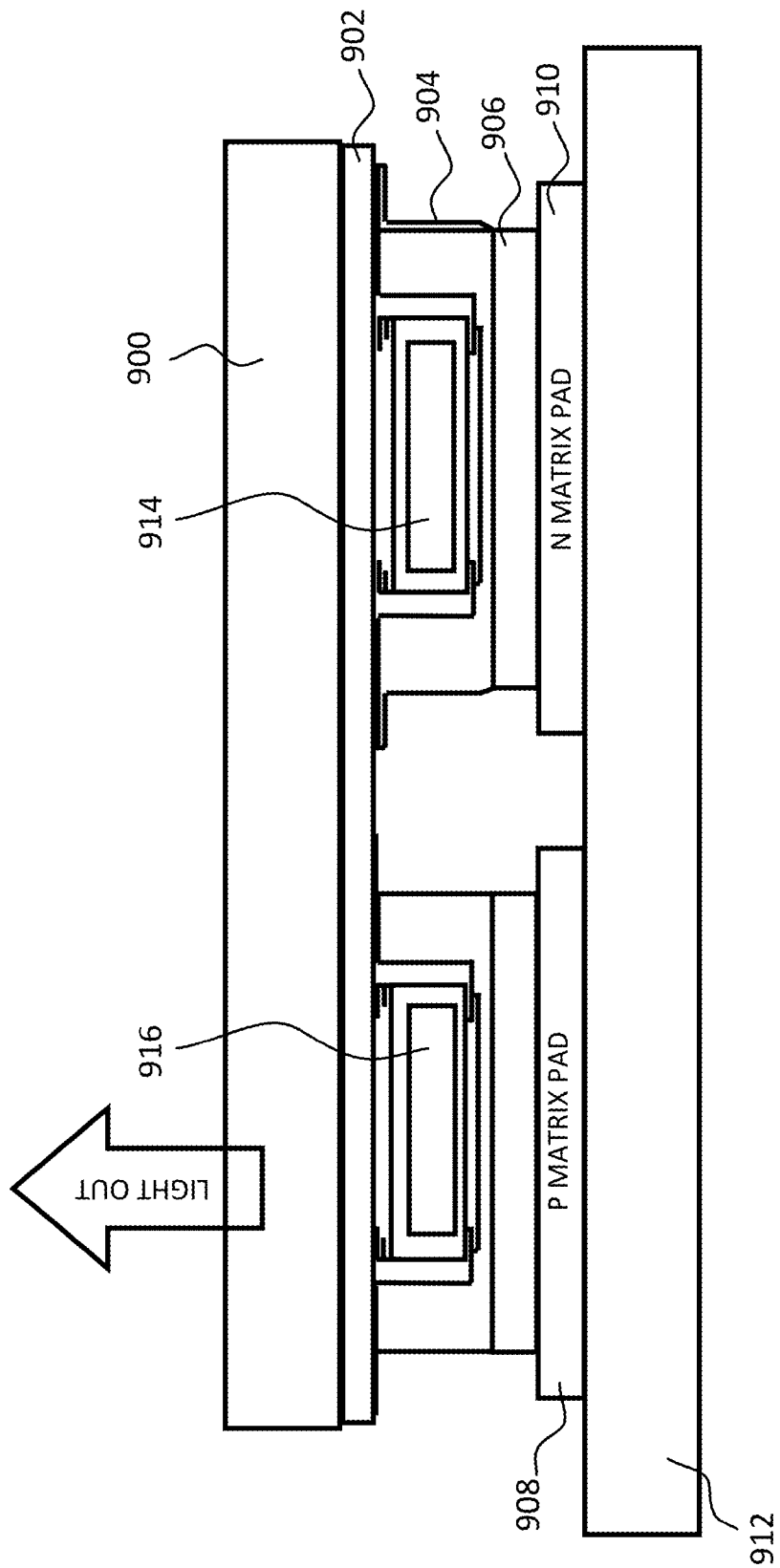
FIG. 9 illustrates an alternative embodiment of FIG. 7 that promotes better thermal management.

In another embodiment, the structure of the device can be changed to a back emitting orientation as illustrated in FIGS. 7-9. In this embodiment a wafer is processed and then flipped upside down and bonded to contacts. In FIG. 7, the mesa structure is fabricated as discussed above in reference to FIG. 5, with epitaxial layers grown on substrate 700, followed by an N-contact layer 702, a dielectric non-conductive layer 704 such as SiN2 covering the structures and opened or etched open to form the deposited P-contact metal layer 712 directly on the doped contact layer 710. The top mirror 708, which becomes the bottom mirror after flip chip bonding, is designed for high reflectance by using a DBR deposition design, by using a grating, or by having other reflective layers added to bring the reflectance to greater than 99%. The device also includes the active region 706 and the partial DBR mirror 704 can have an internal lens incorporated. Using a high percentage of Aluminum in the compositions, and after oxidizing the dielectric AlO2, forming layers as rings with different oxidation lengths would form a lens due to the combined index of refraction differences in the mirror after oxidation. The internal lens can be used to reduce divergence of the beam, which is beneficial to the optical design. Further a plating heat sink of Cu, Au, or other material with good thermal conduction can be used. These layers, structure or contact, including solder contact 714, are formed by the methods outlined in reference to FIG. 5.

In further reference to FIG. 7, the native wavelength beam 724 propagates through the substrate 700. The native wavelength 724 propagates through the polarizing beam splitter element 722 and continues into the optical cavity 718 to be reflected by the appropriately designed reflector 720. As the beam propagates back through the beam splitter 722, the frequency doubled component 728 is reflected out at a perpendicular direction from the cavity.

FIG. 8 illustrates an embodiment of a device similar to the device from FIG. 7, except that the beam splitter and other optical elements are not included. In FIG. 8, the reflected beam 726 from the external mirror 720 returns to the cavity, while the frequency doubled beam component 800 generated by the non-linear crystal propagates through the appropriately designed mirror 720 incident to the surface of the non-linear crystal. In this embodiment, the second harmonic light generated by the frequency doubling crystal is emitted through the cavity reflector with the same filtering and output as described in reference to FIG. 6. It is also noted that the embodiment from FIG. 8 may have additionally included a bandpass filter, allowing only the wavelength generated by the non-linear crystal to pass from the output coupler.

FIG. 9 illustrates yet another variation of the device illustrated in FIG. 7, but the device from FIG. 9 promotes better thermal management due to the direct transfer of the heat sink encompassing the device to the heat sink substrate 912 or carrier with connections 908 and 910 attached using solder 906 or conductive epoxy components. FIG. 9 also shows how the N-contact layer 902 is connected to the N-connection 910 through designing a shorted mesa with a metal deposition 904 to the N-layer.

In further reference to FIG. 9, the bottom emitting structure includes a substrate 900 and a buried N epitaxial layer 902. The N Matrix Line or pad 910 connects with the buried N epitaxial layer 902 through a shorted mesa 914 and metal deposition 904. The other device mesa or structures 916 are not affected by the shorting of the mesa to the N-layer as they are isolated by the mesa etch. Both mesa structures illustrated use different solder deposition pads 906, which may be deposited at the same time to simplify processing. Device 916 is connected to the P matrix connection or pad 908. Both matrix lines and pads are fabricated on the substrate or heat sink 912.

Continuing on to FIG. 11, these optical elements can be designed and applied in multiple ways and achieve similar results as mentioned above. In FIG. 11, VECSEL array chips 1100, 1102 and 1104 are flip chipped bonded to a carrier substrate 1112 with openings. The figure is a cut-away view of the bonded chips. Substrate 1112 can have circuitry including interconnections to drivers. Alternatively, substrate 1112 can include the drivers and/or digital circuitry needed to support the operation of said VECSEL Chips. The substrate 1112 can also be an interconnect to another substrate 1108 with all or none on the circuitry just mentioned. The actual VECSEL chips can also employ circuitry on the chips which is a common design practice. Substrate 1108 here shows openings which allow the VECSEL chips to have heat sinking material 1106 to be applied, which would transfer the heat to heat sink 1110 allowing improved thermal management. Further non-linear crystal 1114 is bonded by techniques mentioned previously herein.

The cavity 1120 of this device has been extended from the bottom mirror of VECSEL chips 1100 and 1102 through all optical components to the external reflector 1122 and 1124. Component 1116, in this illustration, consists of three beam combiners with filtering of wavelengths so that from the returning beams 1126 and 1128, consisting of native wavelength 1126 and 1128 and frequency doubled wavelength 1127 and 1129, are combined and only frequency doubled wavelengths returning from the external reflectors 1122 and 1124 are reflected or combined from the beam splitters, such as beam splitter 1130. As illustrated, the resulting output of VECSEL 1100 is blue and the resulting output of VECSEL 1102 is green. If, for example, the red wavelength resulting from VECSEL 1104 does not need frequency doubling as shown in this illustration, then the beam combiner 1132 can be used to reflect the beam into the combination beam 1134. The result will be combined wavelengths of parallel beams 1134 representing the linear components of all three VECSEL chips 1100, 1102 and 1104 combined. These parallel beams 1134 can then be scanned to an anamorphic lens for combining to produce a pixel, or combined by a prism in another arrangement to form the pixel.

In this embodiment intensity modulation can be produced using the same binary encoding device as described herein, but instead of focusing on color depth or color intensity, the focus can be to generate a string of data that could be encoded onto a single point source or a single pulse. The pulse could then be transmitted either through optical fiber or free space and detected as a specific binary intensity or amplitude, which would represent a string of bits instead of the common one bit of information in a normal data communications pulse. This multiple amplitude technique can produce many times the normal transmission data rate now possible. While intensity modulation is well known, known light sources used for intensity modulation are not configured according to this embodiment, which offers a greater delineation of the resulting signal due to its digital selection of intensities by using multiple arrayed sources designed or calibrated for exact binary or digital intensity.

Further in this embodiment more wavelengths could be added to the same beam with the same technique to produce Wavelength Division Multiplexing (WDM) or Dense WDM (DWDM), with each particular wavelength having bit string information encoded on each of the respective pulses of that wavelength. A device of this nature would produce an extremely high data transfer rate not realized to date. Further, in this device, technology frequency doubling would not need to be used or even frequency adding could be used for longer eye safe wavelengths which is important with higher power laser propagation.

It is noted that a MEMs mirror or scanning device can also be used in conjunction with any of the embodiments disclosed herein. The MEMs mirror or scanning device can deliver the bit/word information pulse to different locations dependent on the MEMs mirror position at any one time.

It is to be understood that in any previously mentioned embodiments with any number of wavelength or wavelengths, or beams produced by the light sources or laser chips, or combination thereof, can be combined to form one highly resolved data pulse, data pulse string, or word with any form of digit whether binary or hexadecimal or the like for data transmission. This device would then be a unique source or transmitter for highly resolved digital Intensity Modulation (IM).

The previously mentioned device can potentially have bit information only limited by the size, focal length, or distance of the combining lens and the number of subgroups that can be defined according to design. Bit string depth or "word" length could be composed of 2 or more bits. 8 bit, 10 bit, 16 bit, 32 bit, 64 bit or greater could be realized.

In another embodiment where the device is used for data transmission, linear arrays can be simultaneously on, using any number of rows or all rows, to form a linear series of pulses that could be delineated from each other even if those pulses had the same or similar wavelengths, because of their output position in relation to each other, and could add a dimensional element to these WDM or DWDM intensity modulated pulses forming a high bandwidth transmission line.

In another embodiment the 1D array is used as a single wavelength pulse producing source combined with other sources of the same but different wavelengths and the combined wavelengths output pulse intensity is scanned in a vertical and horizontal manner. The laser chip could be fabricated out of edge emitting material with common fabrication techniques known to those skilled in the art. The arrays or single devices of varying power according to the digital binary system of outputs described above could then be cleaved and mounted to enable the same method of encoding data transmissions.

Figure 12:
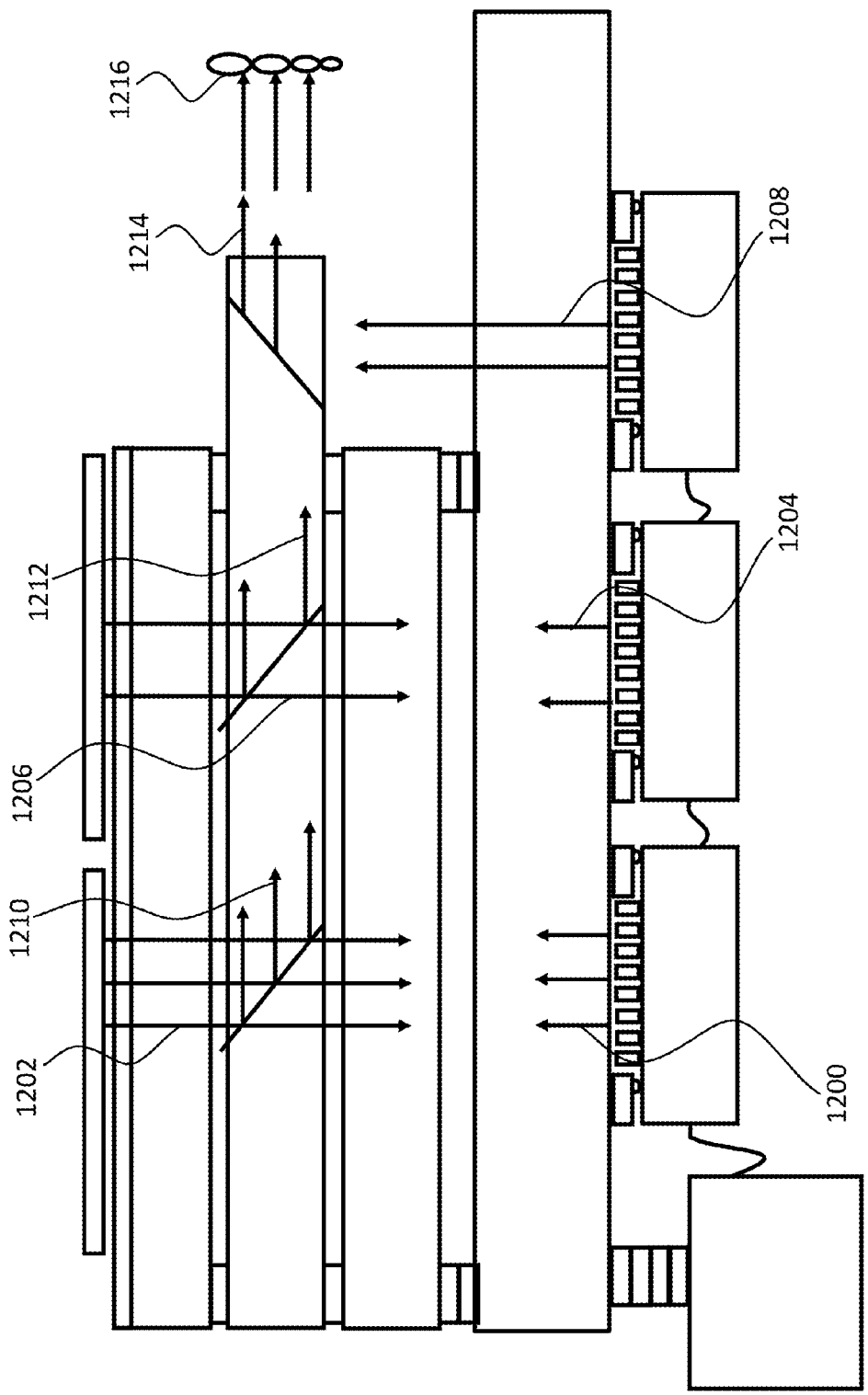
FIG. 12 illustrates a detailed view of the emitting arrangement from FIG. 11.

FIG. 12 shows a close up of the same view of FIG. 11 where beams 1200, 1202 and 1204 are sub-arrays that are turned "on" in each linear array according to each binary on/off state. Beams 1202 and 1206 are intracavity reflected beams from the external or extended mirror. Beams 1210 and 1012 are the frequency doubled beam components from the returning beams having already passed through the non linear frequency doubling crystal. These beams are reflected perpendicular to the cavity direction due to the angular surface that has been coated with a specified wavelength filter allowing only frequency doubled wavelengths to be reflected. All other wavelengths will continue through the angled surface window. Beams 1214 are the reflected beams from the red VEC-SEL chip not needing frequency doubling. All parallel beams 1010, 1012 1014 are now combined and the output is multi-colored parallel beams 1216 which represent the VECSEL subgroups weighted for intensity of three colors.

All linear arrays defining pixel intensities are turned on simultaneously forming a 2D array of parallel beams. A mirror then reflects these parallel beams to an anamorphic lens which combines the linear arrayed component beams into a pixel in one direction and a line of pixels in the other direction. The next image line is created in the same method when the next image line's data is sequenced into the 2D arrays and the mirror continues the scan positioning the next line to its line position in the image plane.

Figure 13:
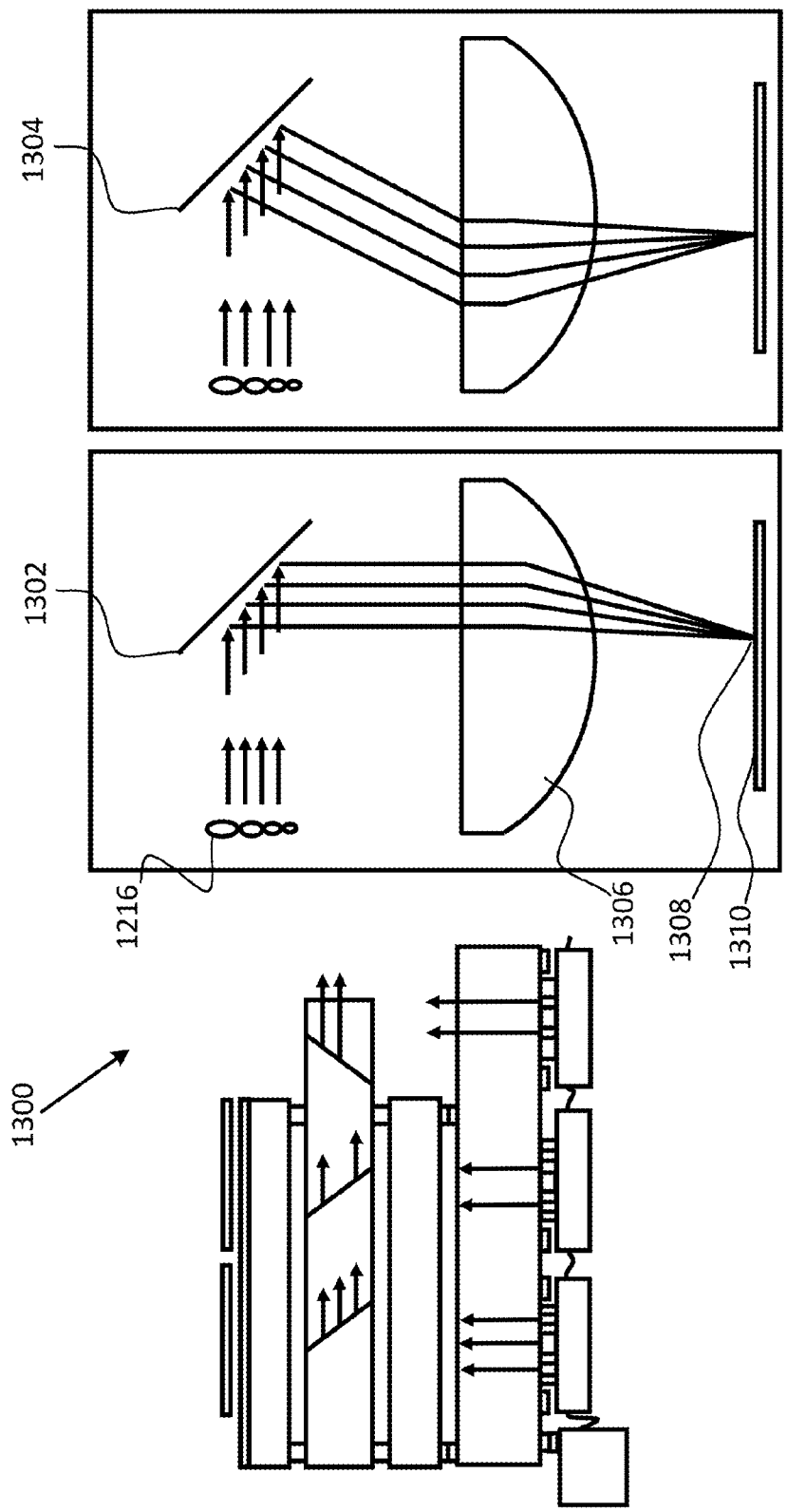
FIG. 13 illustrates the output from FIG. 12 entering the optical path of the scanning mirror and the linear arrays being combined through a cylindrical lens.

FIG. 13 shows the same beams 1216 above, and other similar beams, being reflected by scanning mirrors 1302 and 1304. The parallel reflected beams are incident upon anamorphic lens 1306 causing converging beams to form a point or pixel 1308 with all three color components combined with an all color intensity summation creating the deep and rich color depth. The pixel 1308 being formed at some point in time is the top pixel of an image line of image plane 1310. The image line and other image lines are created by all rows of the 2D arrays forming pixels at the same time in a perpendicular direction to the linear arrayed beams. This perpendicular direction would be looking down at the surface of the paper. The image lines would represent one direction x or y forming the virtual image 1310 while the beam lines scanned across the surface of the image plane 1310 represent the other x or y component of the image 1310.

Using flip chip technology and a design for high speed arrays, with a waveguide being formed around each sub-array or element, the speed and data rate of VCSEL arrays can be increased.

Embodiments described herein enable a device that can be used for mask-less photolithography exposures by using frequency quadrupling instead of frequency doubling which would produce an image with a much shorter wavelength desirable in photolithography. The image produced can be reduced instead of projected for imaging onto a photo resist where the diffraction limits of the device could be the limitation of the feature size for the system. In this embodiment the aperture sizes would be ideally designed as small as possible to reduce feature size. This process can also allow an imaging device for the printing industry with the appropriate wavelengths using any number of combinations for wavelength sources.

Figure 18:
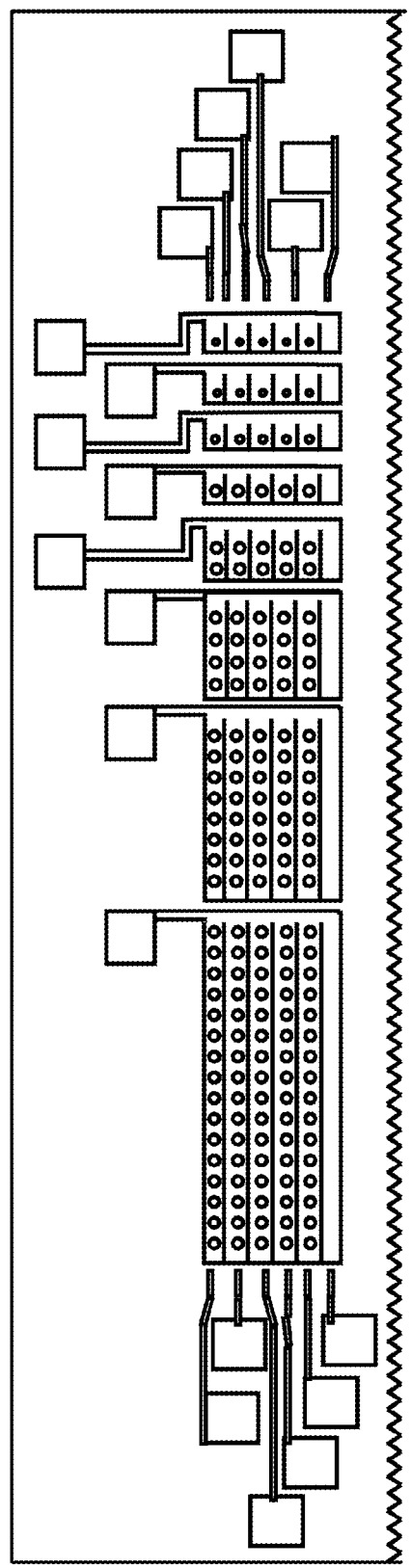
FIG. 18 illustrates a partially cut view of an operational array of laser devices in accordance with an embodiment.

FIG. 18 illustrates partially broken view of an operational array of laser devices in accordance with an embodiment. The operational array is comprised of five linear arrays, each of the linear arrays making up a single row. Each linear array is also comprised of eight sub-arrays, with the first sub-array having the largest number of laser devices and having the largest apertures. On the other hand, the last sub-array, corresponding to the least significant bit, has only a single laser device and this single laser device has an aperture size smaller than the apertures of every laser in the other sub-arrays within the same row. The array operates by turning on each row consecutively. For instance, if the binary string "10100111" is fed into the linear array on the second row, it would result in the first sub-array, the third sub-array, and the last three sub-arrays being turned on, with the other sub-arrays remaining off.

As previously noted, described embodiments of multiple arrays may be used for purposes other than display technologies, such as in communication systems, including free space optical systems and other optical systems. When used in such systems, however, positional grouping of the emitters of the array may cause a detector to only detect patterns from one of a few groups of the emitters. It is therefore desirable to optimize the detection of multiple amplitude levels by ensuring that the detector's position is not positionally sensitive to the beam it is detecting.

Figure 19:
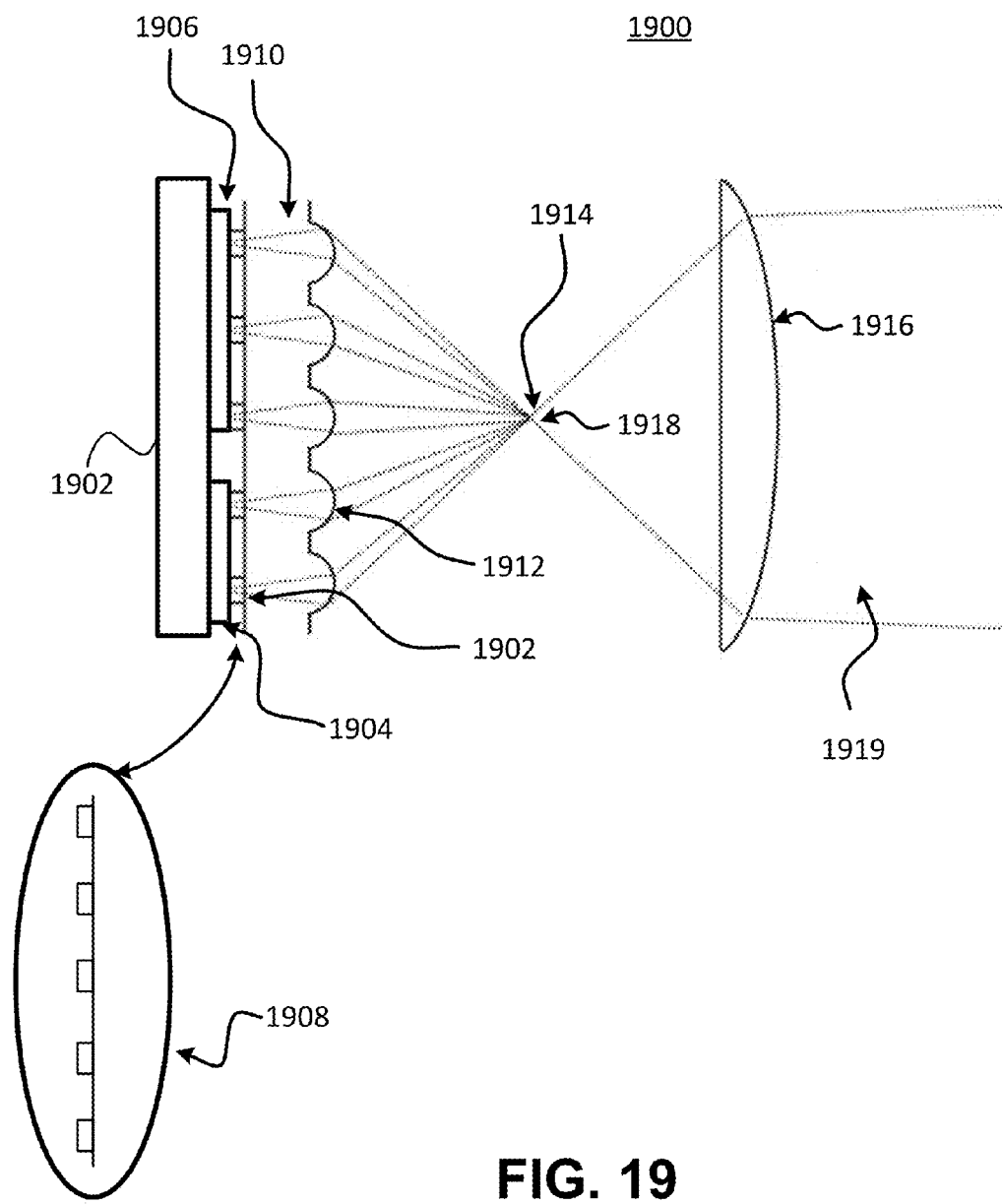
FIG. 19 illustrates an embodiment of an emitter system of binary weighted laser array having a single focal point.

In an embodiment, as illustrated in FIG. 19, a single point source may be generated from the output of the array so the detector need only be positioned to detect the changing amplitudes within this single source. The single focal point may be created from the laser beams of a single array or from all of the laser beams of a group of arrays formed from a combination of lens elements of a micro lens array and laser elements in an array. Each laser of the array may be directed to a single point (virtual or real) by a lens array. In one embodiment, a single focal point may be achieved by assigning different pitches to the elements of the array and the lens array, which may be carried out through photolithography techniques that make alignment of the arrays relative to each other more accurate or the lens array may be an array made of appropriate material for a lens and attached to the back of the substrate. The resulting combination of laser elements and micro lens may cause the laser beams of the array to overlap or come very close to overlapping at a single point. By placing a macro lens at or near the resulting single focal point, the single uniform spot source may then be collimated. Changes in intensity or amplitude of the resulting collimated beam would be uniform over a cross-section of the beam, thereby making detection of the beam much less sensitive to positional changes along the x-axis or the y-axis.

Figure 20:
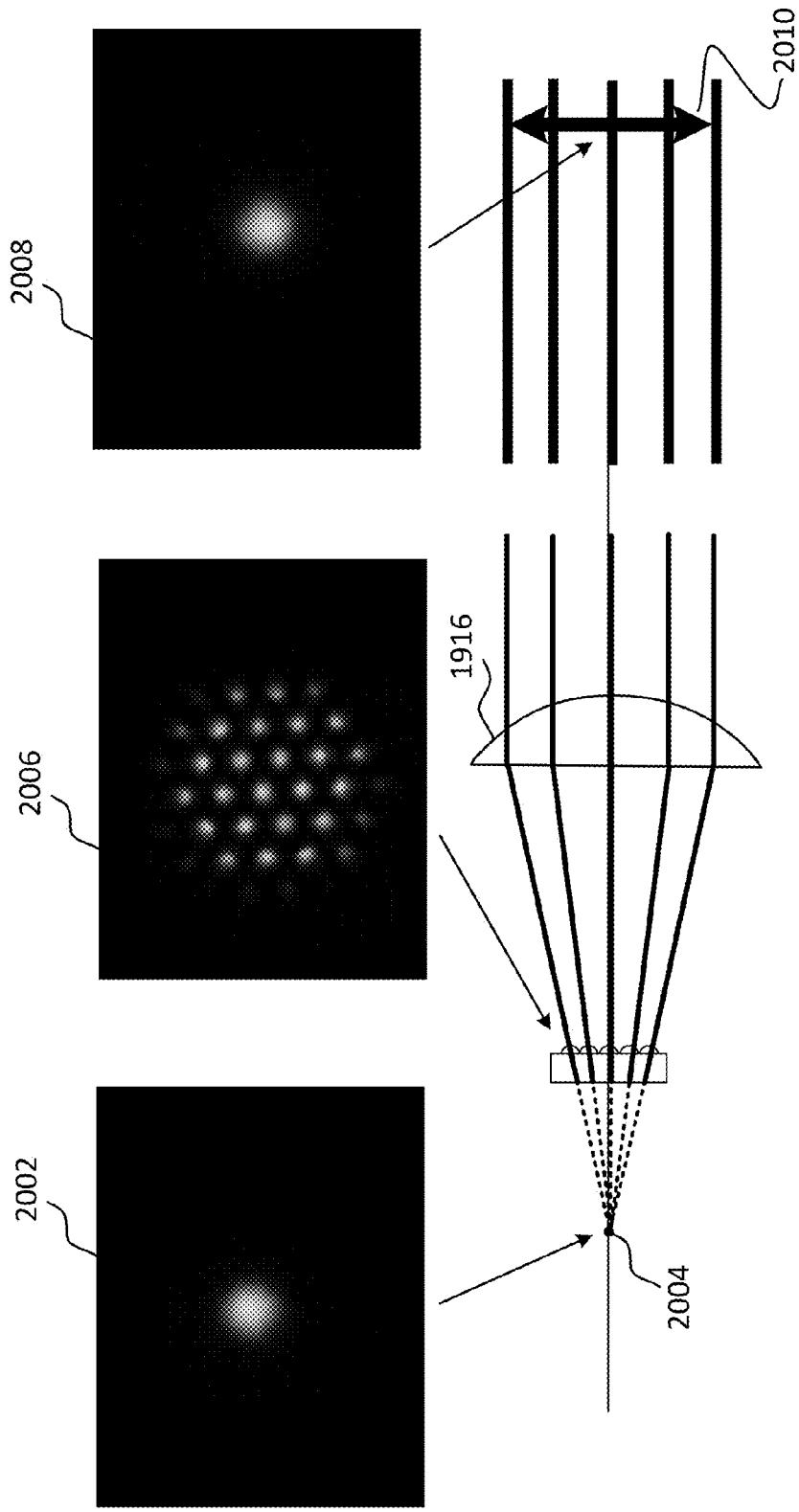
FIG. 20 illustrates laser beam spots at different locations within the emitter system illustrated in FIG. 19.

As further illustrated in FIG. 19, an emitter system 1900 is disclosed, including an array 1902 having at least a first channel 1904 with a first amplitude and a second channel 1906 with a second amplitude. Each of the channels 1904 and 1906 include a plurality of laser array elements 1908 that project, from the laser substrate, diverging beams 1910 that enter the lens array element 1912. The lens array element 1912 focuses and/or reduces the divergence of the beams 1910 to the singular focal point 1914. While the elements illustrated in FIG. 19 are not drawn to scale, the offset between the lens array element 1912 and the laser array 1902 may help to insure that the beams 1910 are focused to the single focal point 1914 as desired. As illustrated in FIG. 19, the focal point 1914 is in front of the array 1902, but could also be a virtual point behind the array 1902, as illustrated in FIG. 20. A macro lens 1916 placed at the focal point 1914 or at the focal point 1918 of the macro lens 1916 may then be used to collimate the beam 1919 as illustrated.

Operation of the emitter system 1900 may be further illustrated with reference to FIG. 20, which illustrates the beam 1910 at different locations within the system. Illustration 2002 illustrates the beam 1910 at the virtual source 2004. Illustration 2006 then shows the beams 1910 as generated by each of the laser arrays of the array 1902, which diverge and are collimated by the collimating macro lens 1916. Illustration 2008 then illustrates a cross section 2010 of the collimated beam 1919 in the far field, which shows the beam 1919 to be uniform in cross section, making it ideal for amplitude detection without sensitivity to which side of the beam the detector is detecting.

Figure 21A:
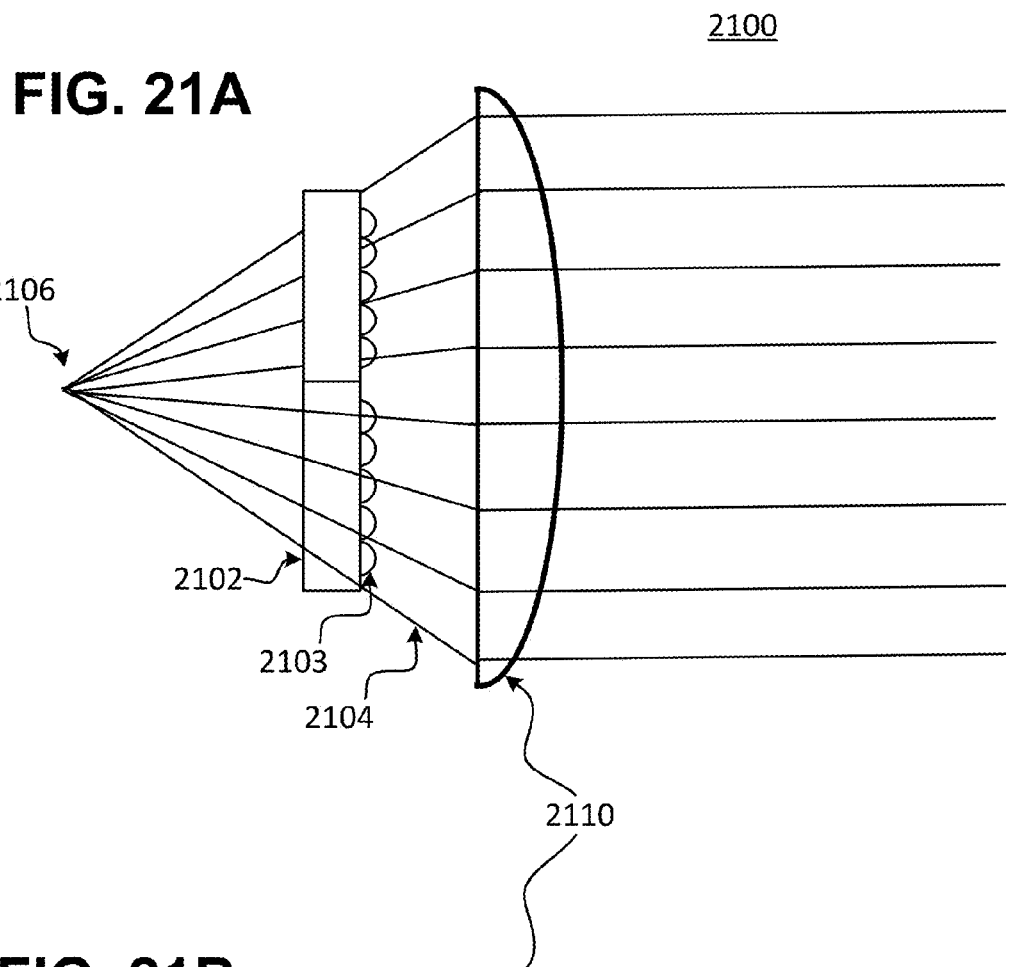
FIGS. 21A and 21B illustrates an embodiment of an emitter system utilizing multiple laser emitting chips and having a single focal point.
Figure 21B:
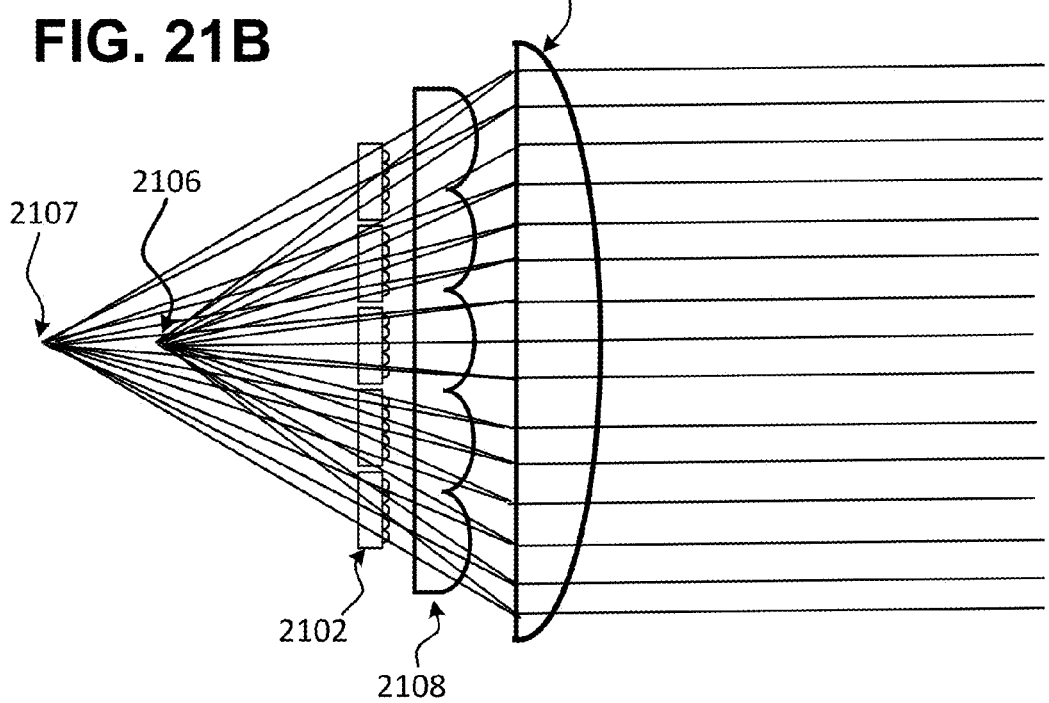

In another embodiment of an emitter system 2100, illustrated in FIG. 21A, multiple laser arrays 2102 may be bonded to a submount (not shown in FIG. 21) with each chip 2102 configured to provide different levels of amplification. The beams 2104 generated by the chips 2102 would have a single focal point, such as virtual focal point 2106, as in the prior embodiment, with each laser and its associated lens array element 2103 offset by an amount necessary to direct the beams 2104 to focus the beams as illustrated and to the collimating macro lens 2110. In FIG. 21B, microlens 2108 is another external microlens array element that has been placed in between the laser array/lens array chips 2102 and the macro lens 2110. Microlens 2108 would help extend the limits of the laser and microlens array offsets and direct the beams to a wider convergence, which may fit the numerical aperture of macrolens 2110. This system creates a new virtual focal point 2107 instead of the focal point 2106 which would be the virtual focal point of a system without microlens element 2108. In particular, the lens of micro lens array 2108 would be of one pitch and the chips 2102 would be spaced at a lesser pitch, which then directs the beams 2104 as necessary to the macro lens 2110. The micro lens arrays 2108 and the chip arrays 2102 may be one or two dimensional arrays. In addition, in this embodiment, each chip 2102 may have a different optical power, for example with a first chip having a first optical power level when turned on at a specific power level or current level, while a second chip has a second optical power level, etc. The optical power levels of these chips 2102 may each be a separate channel (or multiple chips making a single channel). This system may be designed or driven to work in the manner best for the particular detector being used to receive the beams in the receiver system, such as a detector array illustrated in FIG. 24.

Figure 22B:
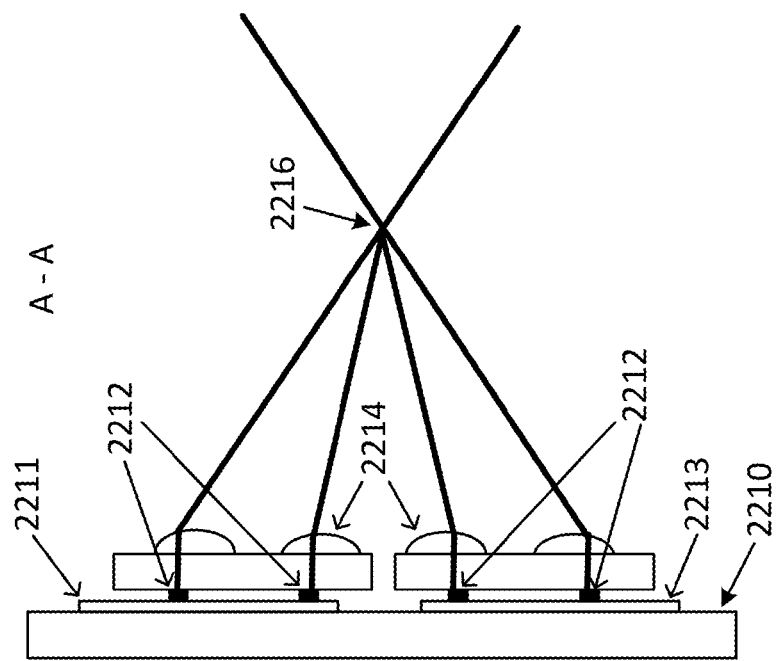
FIGS. 22A and 22B illustrate an embodiment of an emitter system utilizing multiple laser emitting chips with two wavelengths and two amplitudes each and having a single focal point.
Figure 22A:
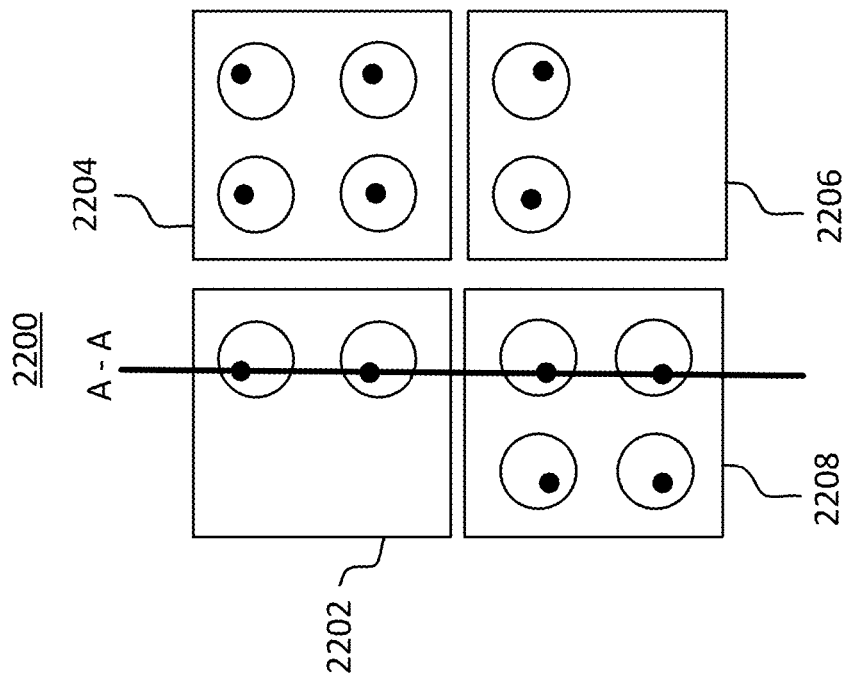

A further embodiment is illustrated in FIGS. 22A and 22B. The emitter system 2200 of FIGS. 22A and 22B is similar to emitter system 2100 in that it includes multiple chips 2202-2208, but is different in that the chips are arranged in a different manner and make use of multiple wavelengths. For example, through binary weighting of the signals applied to the chips, chip 2202 may operate at a first wavelength and a first amplitude, while chip 2204 may operate at the first wavelength and a second amplitude. Likewise, chip 2206 may operate at a second wavelength and a first amplitude, while chip 2208 may operate at the second wavelength and a second amplitude. FIG. 22B illustrates the cross-section A-A of FIG. 22A and shows chips 2202 and 2208 mounted on a submount 2210, with lasers 2212 emitting laser beams into micro lens arrays 2214, which are then focused to the single focal point 2216. Channel 2211 electrically controls the array of lasers from chip 2202 and channel 2213 electrically controls the array of lasers from chip 2208, Channels 2211 and 2213 are fabricated on the substrate 2210 and serve as pads for conductive attachment of the laser chips with the patterned channels on substrate 2210.

Figure 23:
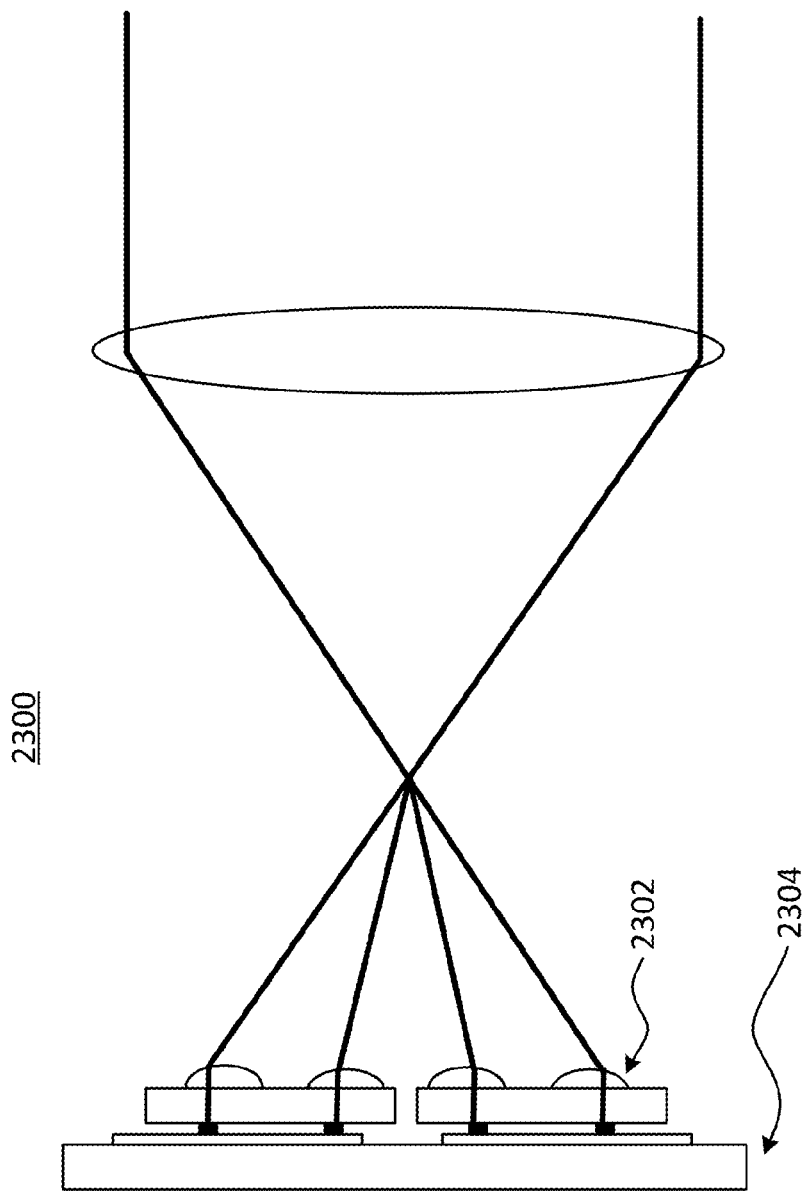
FIG. 23 illustrates an embodiment of a multi-chip emitter system adjusted for signal differentiation.

In yet another embodiment, illustrated in FIG. 23, the amplitudes of the multiple chips 2302 mounted on the submount 2304 may have their amplitudes adjusted to improve detection levels at the detector so as to improve signal differentiation instead of strictly being binary weighted.

Figure 24:
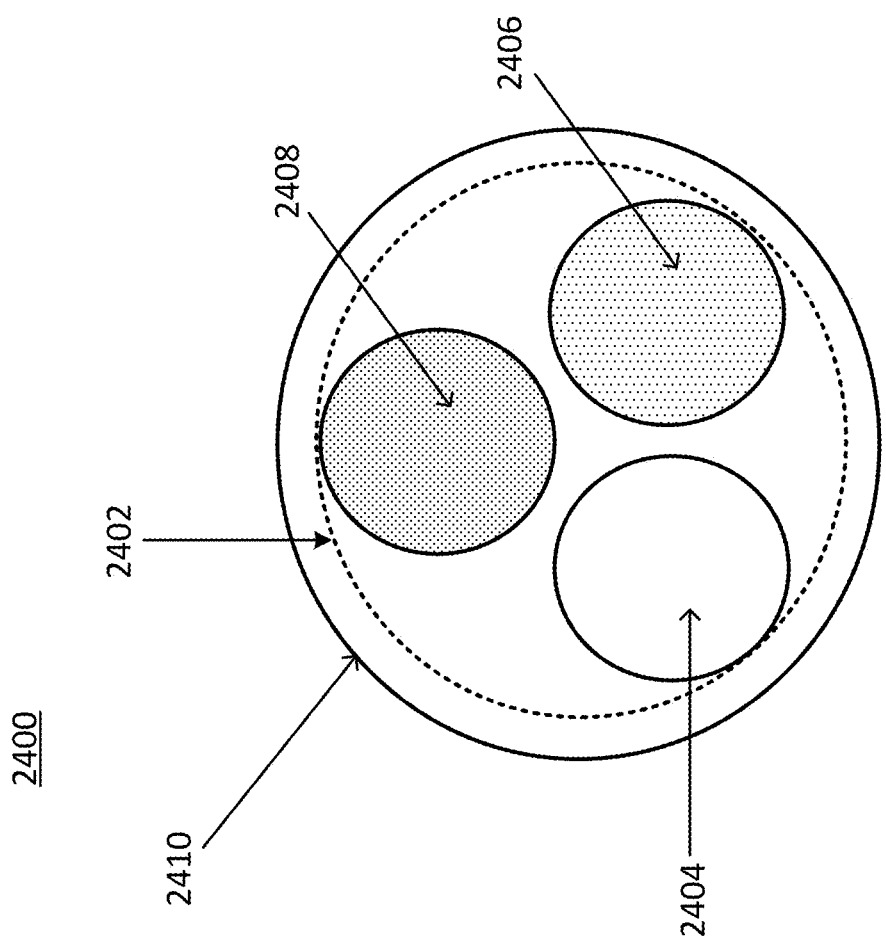
FIG. 24 illustrates an embodiment of a detector array of a two channel detector system.

An embodiment of a detector array 2400 of a detector system (not further shown) is illustrated in FIG. 24. In this embodiment, the binary weighted signals or multiple amplitude signals may be processed using an array 2402 of three detectors 2404, 2406 and 2408 that may each be overfilled by the beam of the emitter system, such as those illustrated in FIGS. 19-23. The beam overfill is illustrated by the beam overfill spot or blur circle 2410. In this embodiment, all of the detectors 2404, 2406 and 2408 are made on the same chip and are identical in design, except that one detector has a neutral density (ND) filter or other beam attenuator deposited on or placed over it, while a second detector has a different beam attenuator deposited on or placed over it. For example, detector 2404 could have no attenuation, detector 2406 has some attenuation, and detector 2408 has the most attenuation. For a two channel (two amplitude) beam emitter system, the detector system would need to detect states of 00, 01, 10 and 11, or four different levels of beam amplitudes or powers. If no signal is detected by any of the detectors, this may represent state 00. State 01 may be represented when detector 2404, the most sensitive detector, detects a signal while no signal is detected by the two other detectors. If detectors 2404 and 2406 detect a signal, but detector 2408 does not, that may be state 10. State 11 may be represented by all detectors detecting a signal.

In the above embodiments of the emitter systems and detector systems, the power levels of the channels generated by the arrays may be described as being doubled, but there are no limits on the power level variations between the different channels. For example, the power of one channel may be 1.5 times another array or some other multiple of a power level N.

Embodiments may include a system for combining the output of semiconductor light devices to generate a single light beam, comprising: a set of one or more semiconductor light devices configured to generate a plurality of light beams representing a first channel of data; a binary string containing digital data, each bit from the binary string controlling a power of each of the one or more semiconductor light devices from the set of one or more semiconductor light devices, wherein an amplitude of a light beam generated by each semiconductor light device is determined by a position of a particular bit controlling each semiconductor light device, the amplitude encoding the digital data in the light beam; a lens array positioned over the set of semiconductor light devices and configured to focus the plurality of light beams to a single focal point; and a macro lens positioned beyond the lens array and configured to collimate the plurality of light beams into the single light beam carrying the digital data for the first channel.

In such embodiments, the set of one or more semiconductor light devices may include one or more laser arrays. In such embodiments, the set of one or more semiconductor light devices may be light emitting diodes. In such embodiments, the set of one or more semiconductor light devices may be resonant cavity light emitting diodes. In such embodiments, the set of one or more semiconductor light devices may include a plurality of laser chips. In such embodiments, the plurality of light beams may include a plurality of wavelengths. In such embodiments, the macro lens may be positioned at or near the single focal point. In such embodiments, the system may further comprise a second lens array positioned between the lens array and the macro lens and configured to change a location of the single focal point, to extend an offset of the set of one or more semiconductor light devices, to extend an offset of the lens array, and to direct the plurality of laser beams to a wider convergence that fits a numerical aperture of the macro lens. In such embodiments, the system may further comprise an array of detectors positioned in a far field of the single light beam, each of the detectors in the array of detectors having a different attenuation and being configured to detect multiple amplitude encoded signals from the single focal point at a rate of at least 1 gigabit per second. In such embodiments, the system may further comprise an electrical channel for controlling the set of one or more semiconductor light devices and upon which the set of one or more semiconductor light devices are mounted; and a submount upon which the electrical channel is mounted.

In such embodiments, the system may further comprise: one or more sets of additional semiconductor light devices configured to generate one or more additional plurality of light beams representing one or more additional channels of data; one or more additional binary strings containing digital data, each bit from the one or more additional binary strings controlling the power of each of the one or more additional semiconductor light devices from the one or more sets of additional semiconductor light devices, wherein the amplitude of the light beam generated by each additional semiconductor light device is determined by the position of the particular bit controlling each additional semiconductor light device, the amplitude encoding the digital data in the light beam; and one or more additional lens arrays positioned over the one or more additional sets of semiconductor light devices and configured to focus the one or more additional plurality of light beams to the single focal point, wherein the macro lens is further configured to collimate the one or more additional plurality of light beams into the single light beam carrying the digital data for the one or more additional channels.

In such embodiments, the system may further comprise: one or more sets of additional semiconductor light devices configured to generate one or more additional plurality of light beams representing one or more additional channels of data; one or more additional binary strings containing digital data, each bit from the one or more additional binary strings controlling the power of each of the one or more additional semiconductor light devices from the one or more sets of additional semiconductor light devices, wherein the amplitude of the light beam generated by each additional semiconductor light device is determined by the position of the particular bit controlling each additional semiconductor light device, the amplitude encoding the digital data in the light beam; wherein the one or more additional lens arrays are further positioned over the one or more additional sets of semiconductor light devices and configured to focus the one or more additional plurality of light beams to the single focal point, and wherein the macro lens is further configured to collimate the one or more additional plurality of light beams into the single light beam carrying the digital data for the one or more additional channels.

In such embodiments, the set of one or more semiconductor light devices and the one or more sets of additional semiconductor light devices may include one or more laser arrays. In such embodiments, the set of one or more semiconductor light devices and the one or more sets of additional semiconductor light devices may be light emitting diodes. In such embodiments, the set of one or more semiconductor light devices and the one or more sets of additional semiconductor light devices may be resonant cavity light emitting diodes. In such embodiments, the set of one or more semiconductor light devices and the one or more sets of additional semiconductor light devices may include a plurality of laser chips. In such embodiments, the plurality of light beams and the one or more additional plurality of light beams may include a plurality of wavelengths. In such embodiments, the macro lens may be positioned at or near the single focal point. In such embodiments, the system may further comprise a second lens array positioned between the lens array, the one or more additional lens arrays and the macro lens and configured to change a location of the single focal point, to extend an offset of the set of one or more semiconductor light devices and the one or more sets of additional semiconductor light devices, to extend an offset of the lens array and the one or more additional lens arrays, and to direct the plurality of laser beams and the one or more additional plurality of laser beams to a wider convergence that fits a numerical aperture of the macro lens.

In such embodiments, the system may further comprise an array of detectors positioned in a far field of the single light beam, each of the detectors in the array of detectors having a different attenuation and being configured to detect multiple amplitude encoded signals from the single focal point at a rate of at least 1 gigabit per second. In such embodiments, the system may further comprise: a first electrical channel for controlling the set of one or more semiconductor light devices and upon which the set of one or more semiconductor light devices are mounted; one or more additional electrical channel for controlling the one or more sets of additional semiconductor light devices and upon which the one or more sets of additional semiconductor light devices are mounted; and a submount upon which the first electrical channel and the one or more additional electrical channels are mounted. In such embodiments, the set of one or more semiconductor light devices and the lens arrays may be formed within a first set of one or more laser chips, wherein the one or more sets of additional semiconductor light devices and the one or more additional lens arrays may be formed with one or more additional laser chips, and wherein the first set of one or more laser chips and the one or more additional laser chips may be mounted to a common submount.

While the present invention has been illustrated and described herein in terms of a preferred embodiment and several alternatives, it is to be understood that the techniques described herein can have a multitude of additional uses and applications. Accordingly, the invention should not be limited to just the particular description and various drawing figures contained in this specification that merely illustrate a preferred embodiment and application of the principles of the invention.

What is claimed:

1. A system for combining the output of semiconductor light devices to generate a single light beam, comprising:
    a set of one or more semiconductor light devices configured to generate a plurality of light beams representing a first channel of data;
    a binary string containing digital data, each bit from the binary string controlling a power of each of the one or more semiconductor light devices from the set of one or more semiconductor light devices, wherein an amplitude of a light beam generated by each semiconductor light device is determined by a position of a particular bit controlling each semiconductor light device, the amplitude encoding the digital data in the light beam;
    a lens array positioned over the set of semiconductor light devices and configured to focus the plurality of light beams to a single focal point; and
    a macro lens positioned beyond the lens array and configured to collimate the plurality of light beams into the single light beam carrying the digital data for the first channel.

2. The system as recited in claim 1, wherein the set of one or more semiconductor light devices includes one or more laser arrays.

3. The system as recited in claim 1, wherein the set of one or more semiconductor light devices are light emitting diodes.

4. The system as recited in claim 1, wherein the set of one or more semiconductor light devices are resonant cavity light emitting diodes.

5. The system as recited in claim 1, wherein the set of one or more semiconductor light devices include a plurality of laser chips.

6. The system as recited in claim 1, wherein the plurality of light beams include a plurality of wavelengths.

7. The system as recited in claim 1, wherein the macro lens is positioned at or near the single focal point.

8. The system as recited in claim 1, further comprising a second lens array positioned between the lens array and the macro lens and configured to change a location of the single focal point, to extend an offset of the set of one or more semiconductor light devices, to extend an offset of the lens array, and to direct the plurality of laser beams to a wider convergence that fits a numerical aperture of the macro lens.

9. The system as recited in claim 1, further comprising an array of detectors positioned in a far field of the single light beam, each of the detectors in the array of detectors having a different attenuation and being configured to detect multiple amplitude encoded signals from the single focal point at a rate of at least 1 gigabit per second.

10. The system as recited in claim 1, further comprising:
    an electrical channel for controlling the set of one or more semiconductor light devices and upon which the set of one or more semiconductor light devices are mounted; and
    a submount upon which the electrical channel is mounted.

11. The system as recited in claim 1, further comprising:
    one or more sets of additional semiconductor light devices configured to generate one or more additional plurality of light beams representing one or more additional channels of data;
    one or more additional binary strings containing digital data, each bit from the one or more additional binary strings controlling the power of each of the one or more additional semiconductor light devices from the one or more sets of additional semiconductor light devices, wherein the amplitude of the light beam generated by each additional semiconductor light device is determined by the position of the particular bit controlling each additional semiconductor light device, the amplitude encoding the digital data in the light beam; and
    one or more additional lens arrays positioned over the one or more additional sets of semiconductor light devices and configured to focus the one or more additional plurality of light beams to the single focal point, wherein the macro lens is further configured to collimate the one or more additional plurality of light beams into the single light beam carrying the digital data for the one or more additional channels.

12. The system as recited in claim 11, wherein the set of one or more semiconductor light devices and the one or more sets of additional semiconductor light devices include one or more laser arrays.

13. The system as recited in claim 11, wherein the set of one or more semiconductor light devices and the one or more sets of additional semiconductor light devices are light emitting diodes.

14. The system as recited in claim 11, wherein the set of one or more semiconductor light devices and the one or more sets of additional semiconductor light devices are resonant cavity light emitting diodes.

15. The system as recited in claim 11, wherein the set of one or more semiconductor light devices and the one or more sets of additional semiconductor light devices include a plurality of laser chips.

16. The system as recited in claim 11, wherein the plurality of light beams and the one or more additional plurality of light beams include a plurality of wavelengths.

17. The system as recited in claim 11, wherein the macro lens is positioned at or near the single focal point.

18. The system as recited in claim 11, further comprising a second lens array positioned between the lens array, the one or more additional lens arrays and the macro lens and configured to change a location of the single focal point, to extend an offset of the set of one or more semiconductor light devices and the one or more sets of additional semiconductor light devices, to extend an offset of the lens array and the one or more additional lens arrays, and to direct the plurality of laser beams and the one or more additional plurality of laser beams to a wider convergence that fits a numerical aperture of the macro lens.

19. The system as recited in claim 11, further comprising an array of detectors positioned in a far field of the single light beam, each of the detectors in the array of detectors having a different attenuation and being configured to detect multiple amplitude encoded signals from the single focal point at a rate of at least 1 gigabit per second.

20. The system as recited in claim 11, further comprising:
a first electrical channel for controlling the set of one or more semiconductor light devices and upon which the set of one or more semiconductor light devices are mounted;
one or more additional electrical channel for controlling the one or more sets of additional semiconductor light devices and upon which the one or more sets of additional semiconductor light devices are mounted; and
a submount upon which the first electrical channel and the one or more additional electrical channels are mounted.

21. The system as recited in claim 11, wherein the set of one or more semiconductor light devices and the lens arrays are formed within a first set of one or more laser chips, wherein the one or more sets of additional semiconductor light devices and the one or more additional lens arrays are formed with one or more additional laser chips, and wherein the first set of one or more laser chips and the one or more additional laser chips are mounted to a common submount.

22. The system as recited in claim 1, further comprising:
one or more sets of additional semiconductor light devices configured to generate one or more additional plurality of light beams representing one or more additional channels of data;
one or more additional binary strings containing digital data, each bit from the one or more additional binary strings controlling the power of each of the one or more additional semiconductor light devices from the one or more sets of additional semiconductor light devices, wherein the amplitude of the light beam generated by each additional semiconductor light device is determined by the position of the particular bit controlling each additional semiconductor light device, the amplitude encoding the digital data in the light beam; wherein the one or more additional lens arrays are further positioned over the one or more additional sets of semiconductor light devices and configured to focus the one or more additional plurality of light beams to the single focal point, and wherein the macro lens is further configured to collimate the one or more additional plurality of light beams into the single light beam carrying the digital data for the one or more additional channels.

23. The system as recited in claim 22, wherein the set of one or more semiconductor light devices and the one or more sets of additional semiconductor light devices include one or more laser arrays.

24. The system as recited in claim 22, wherein the set of one or more semiconductor light devices and the one or more sets of additional semiconductor light devices are light emitting diodes.

25. The system as recited in claim 22, wherein the set of one or more semiconductor light devices and the one or more sets of additional semiconductor light devices are resonant cavity light emitting diodes.

26. The system as recited in claim 22, wherein the set of one or more semiconductor light devices and the one or more sets of additional semiconductor light devices include a plurality of laser chips.

27. The system as recited in claim 22, wherein the plurality of light beams and the one or more additional plurality of light beams include a plurality of wavelengths.

28. The system as recited in claim 22, wherein the macro lens is positioned at or near the single focal point.

29. The system as recited in claim 22, further comprising a second lens array positioned between the lens array, the one or more additional lens arrays and the macro lens and configured to change a location of the single focal point, to extend an offset of the set of one or more semiconductor light devices and the one or more sets of additional semiconductor light devices, to extend an offset of the lens array and the one or more additional lens arrays, and to direct the plurality of laser beams and the one or more additional plurality of laser beams to a wider convergence that fits a numerical aperture of the macro lens.

30. The system as recited in claim 22, further comprising an array of detectors positioned in a far field of the single light beam, each of the detectors in the array of detectors having a different attenuation and being configured to detect multiple amplitude encoded signals from the single focal point at a rate of at least 1 gigabit per second.

31. The system as recited in claim 22, further comprising:
a first electrical channel for controlling the set of one or more semiconductor light devices and upon which the set of one or more semiconductor light devices are mounted;
one or more additional electrical channel for controlling the one or more sets of additional semiconductor light devices and upon which the one or more sets of additional semiconductor light devices are mounted; and
a submount upon which the first electrical channel and the one or more additional electrical channels are mounted.

32. The system as recited in claim 22, wherein the set of one or more semiconductor light devices and the lens arrays are formed within a first set of one or more laser chips, wherein the one or more sets of additional semiconductor light devices and the one or more additional lens arrays are formed with one or more additional laser chips, and wherein the first set of one or more laser chips and the one or more additional laser chips are mounted to a common submount.

* * * * *